United States Patent
Isobe et al.

(10) Patent No.: US 6,731,149 B2
(45) Date of Patent: May 4, 2004

(54) SYNCHRONIZING CIRCUIT FOR GENERATING A SIGNAL SYNCHRONIZING WITH A CLOCK SIGNAL

(75) Inventors: Katsuaki Isobe, Kawasaki (JP); Tsuneo Inaba, Yokohama (JP); Hironobu Akita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/003,312

(22) Filed: Dec. 6, 2001

(65) Prior Publication Data

US 2002/0036524 A1 Mar. 28, 2002

Related U.S. Application Data

(62) Division of application No. 09/505,204, filed on Feb. 16, 2000, now Pat. No. 6,359,480.

(30) Foreign Application Priority Data

Feb. 17, 1999 (JP) ............................................. 11-038574

(51) Int. Cl.[7] ................................................. H03K 5/01
(52) U.S. Cl. ........................ 327/165; 327/175; 327/176
(58) Field of Search .................................. ; H03K 5/01

(56) References Cited

U.S. PATENT DOCUMENTS

| | | | | |
|---|---|---|---|---|
| 3,906,256 A | * | 9/1975 | Suzuki et al. | 327/110 |
| 3,920,962 A | | 11/1975 | Mayer et al. | |
| 4,237,422 A | | 12/1980 | Lenhardt | |
| 4,710,648 A | | 12/1987 | Hanamura et al. | |
| 4,933,579 A | * | 6/1990 | Isobe et al. | 326/56 |
| 5,146,110 A | * | 9/1992 | Kim et al. | 327/537 |
| 5,287,025 A | | 2/1994 | Nishimichi | |
| 5,319,253 A | * | 6/1994 | You | 327/51 |
| 5,438,550 A | | 8/1995 | Kim | |
| 5,498,989 A | | 3/1996 | Diba | |
| 5,606,270 A | * | 2/1997 | D'Souza et al. | 326/98 |
| 5,671,214 A | | 9/1997 | Tanaka | |
| 5,682,113 A | * | 10/1997 | Park et al. | 327/175 |
| 5,708,382 A | * | 1/1998 | Park | 327/277 |
| 5,723,993 A | * | 3/1998 | Cha | 327/172 |
| 5,867,432 A | | 2/1999 | Toda | |
| 5,914,624 A | * | 6/1999 | Son | 327/264 |
| 6,016,070 A | * | 1/2000 | Uehara | 327/176 |
| 6,069,508 A | | 5/2000 | Takai | |
| 6,078,193 A | * | 6/2000 | Bazuin et al. | 326/93 |
| 6,140,855 A | | 10/2000 | Kirihata et al. | |
| 6,141,127 A | | 10/2000 | Boivin et al. | |
| 6,449,727 B1 | | 9/2002 | Toda | |

FOREIGN PATENT DOCUMENTS

| | | |
|---|---|---|
| JP | 10-069326 A | 3/1998 |
| JP | 11-316706 A | 11/1999 |

* cited by examiner

*Primary Examiner*—Timothy P. Callahan
*Assistant Examiner*—An T. Luu
(74) *Attorney, Agent, or Firm*—Banner & Witcoff, Ltd.

(57) ABSTRACT

A first delay line for forward pulses and a second delay line for backward pulses are composed of unit delay elements. A state holding section determines the input position of a backward pulse on the second delay line according to the transfer position of a forward pulse transferred along the first delay line. In the unit delay elements constituting the first and second delay lines, the accuracy of synchronization can be improved by increasing the current driving capability of the transistors related to the rising of the pulse signal.

5 Claims, 28 Drawing Sheets

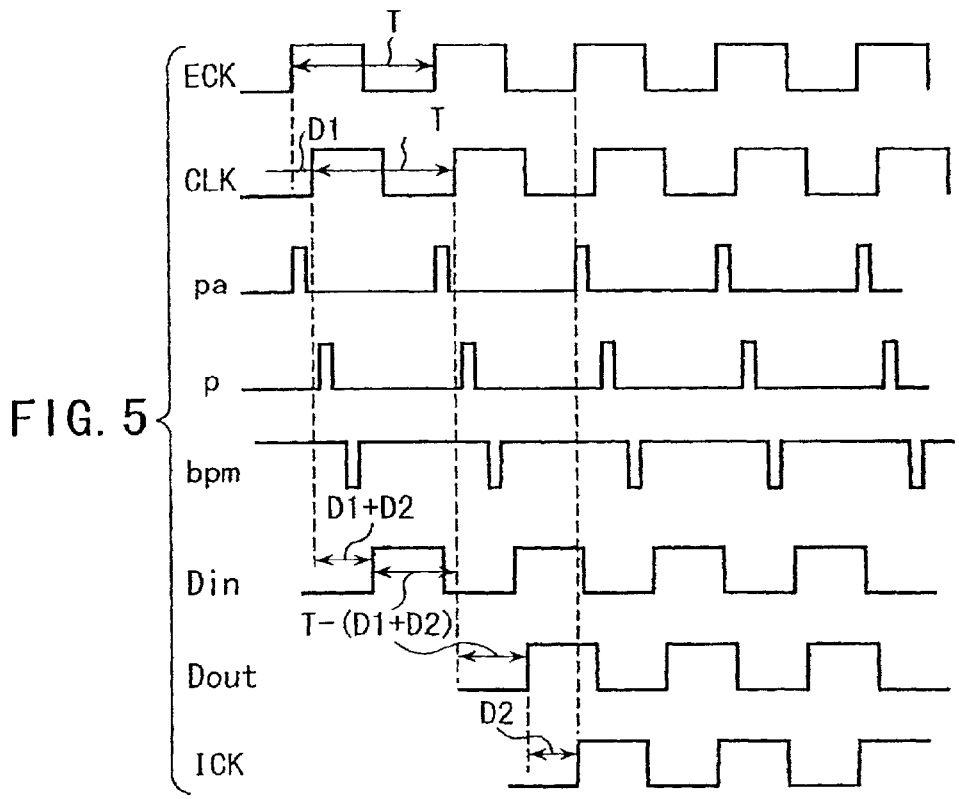
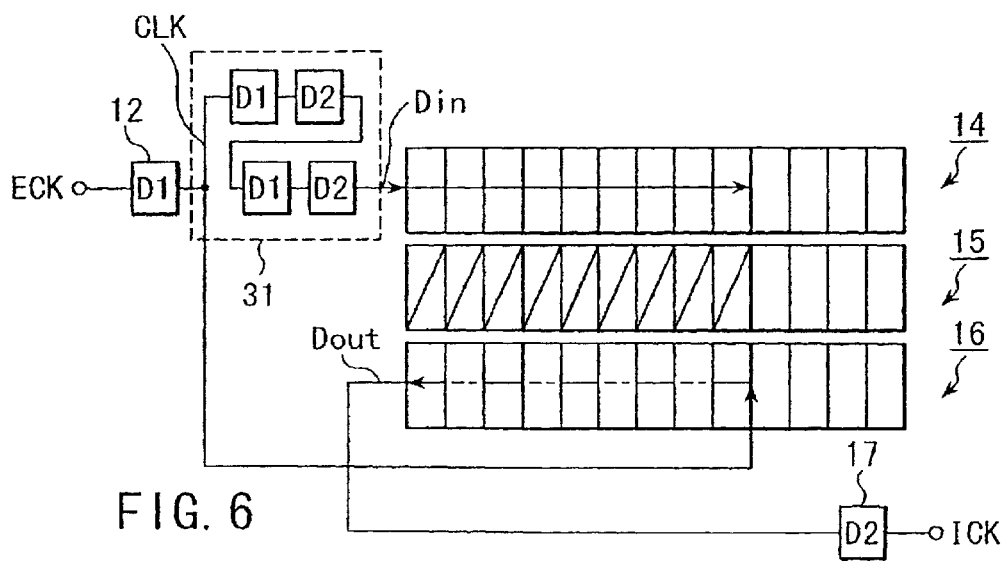
FIG. 5
FIG. 6

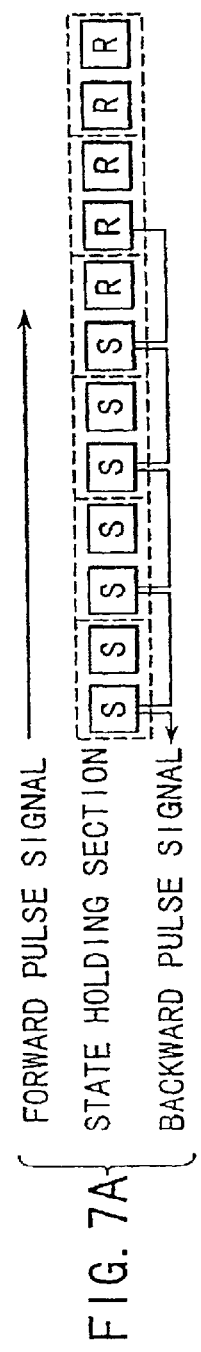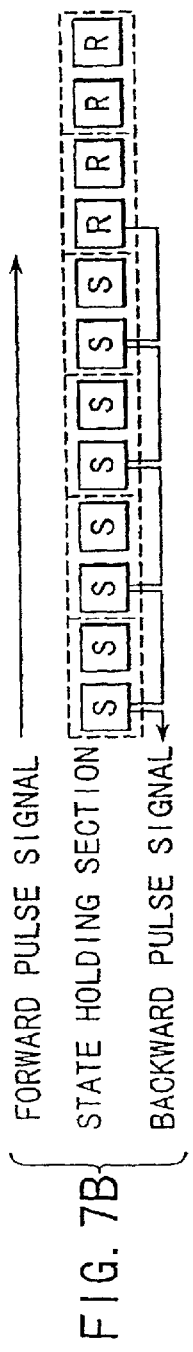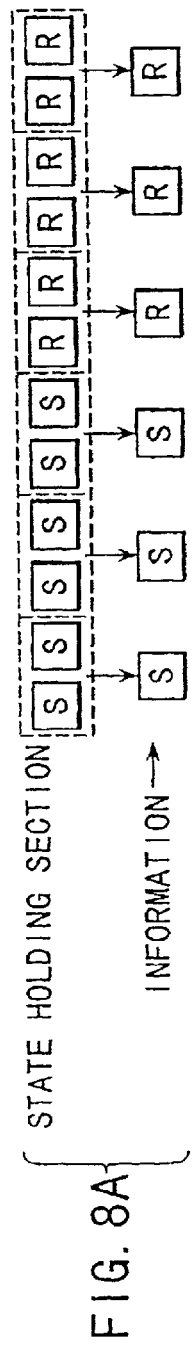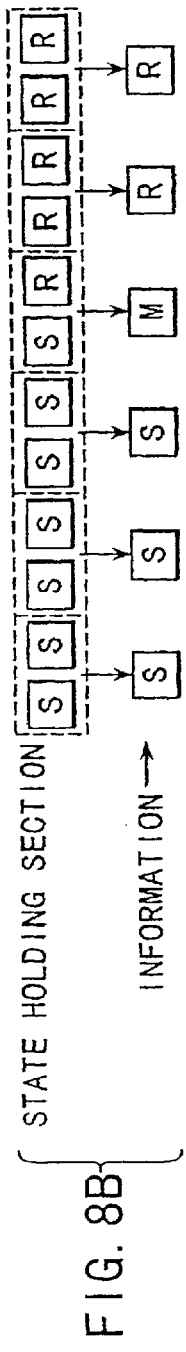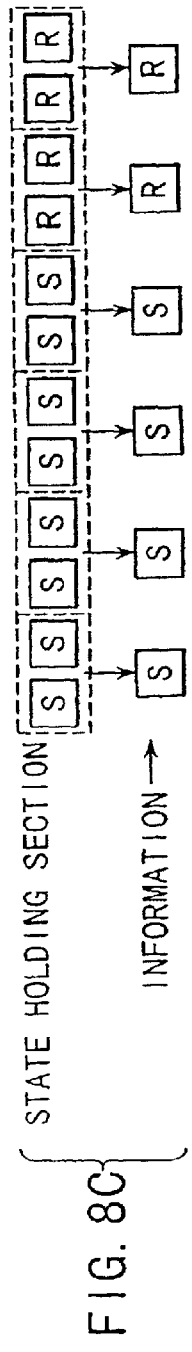

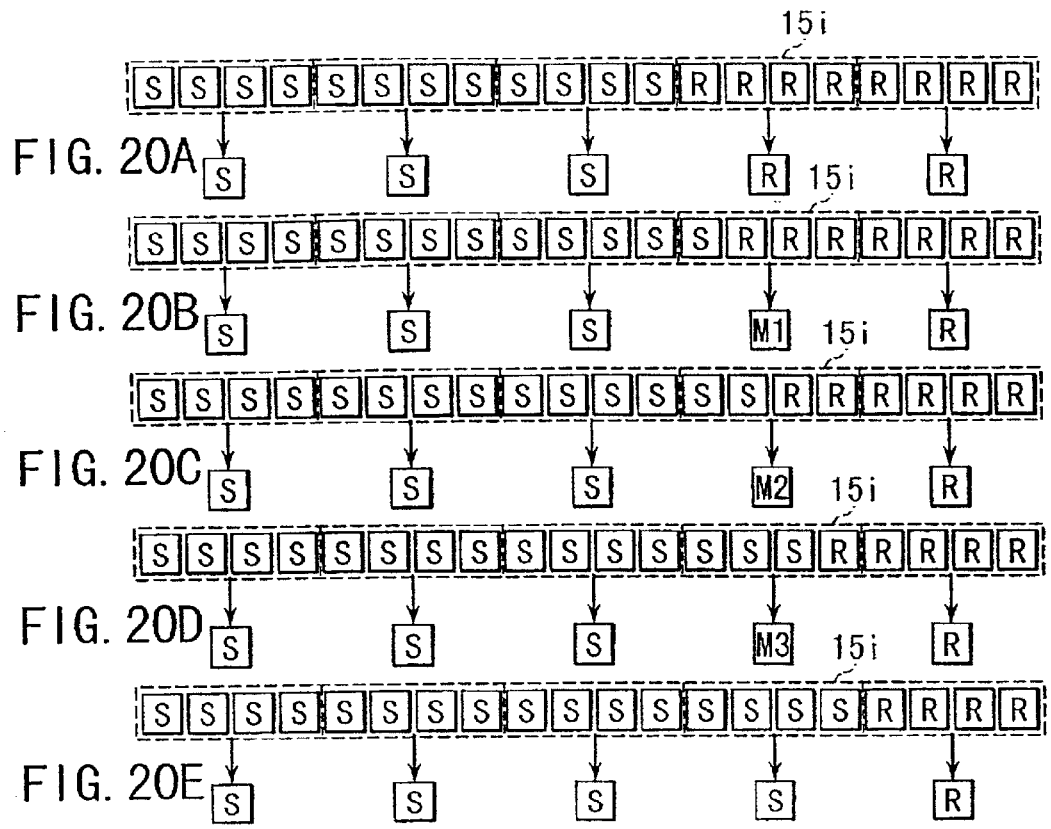
FIG. 20A
FIG. 20B
FIG. 20C
FIG. 20D
FIG. 20E
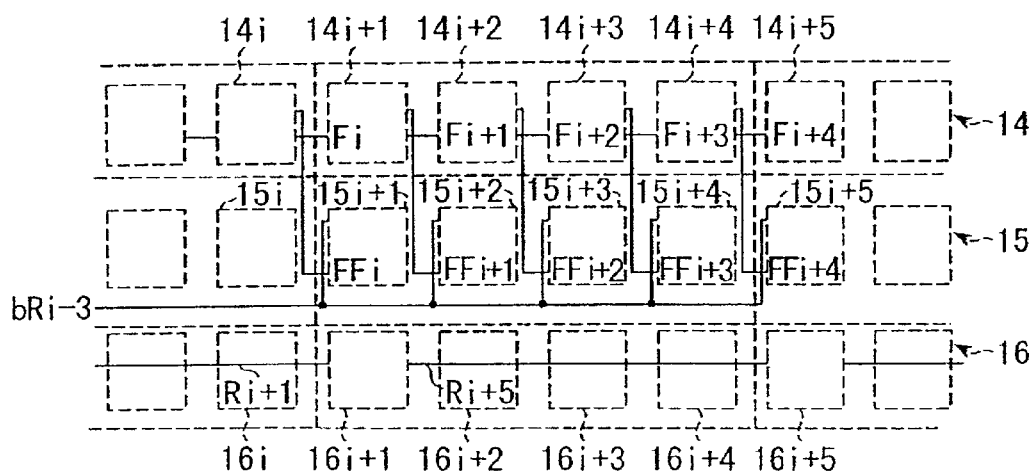
FIG. 21

SYNCHRONIZING CIRCUIT FOR GENERATING A SIGNAL SYNCHRONIZING WITH A CLOCK SIGNAL

CROSS-REFERENCE TO RELATED APPLICATION

This application is a divisional of U.S. patent application Ser. No. 09/505,204, filed Feb. 16, 2000, which issued on Mar. 19, 2002 as U.S. Pat. No. 6,359,480, which is based upon and claims the benefit of priority from the prior Japanese Patent Application No. 11-038574, filed Feb. 17, 1999, the entire contents of which are incorporated herein by reference.

BACKGROUND OF THE INVENTION

This invention relates to a synchronizing circuit which generates a signal synchronizing with an external clock signal and is applied to, for example, a synchronous DRAM.

One known circuit for generating an internal clock signal synchronizing with an external clock signal is a SAD (Synchronous Adjustable Delay) synchronizing circuit. This type of synchronizing circuit supplies an external clock signal to a first delay line composed of unit delay elements without using a feedback loop. The period of the clock signal transferred to the first delay line is measured directly. Information on the measured period is stored in a state holding section. On the basis of the information stored in the state holding section, a new clock signal is supplied to a second delay line composed of unit delay elements. This produces a clock signal which synchronizes with the external clock and lags behind by an integral multiple of the period from the external clock signal.

In this type of synchronizing circuit, the accuracy with which the internal clock signal synchronizes with the external clock signal depends on the amount of delay in the unit delay elements. To transfer data at high speed, it is necessary to increase the frequency of the clock signal. When the frequency of the clock signal has increased to such an extent that it cannot be ignored as compared with the amount of delay in the unit delay elements, the accuracy of synchronization can decrease.

BRIEF SUMMARY OF THE INVENTION

It is, accordingly, an object of the present invention to overcome the above problem by providing a synchronizing circuit capable of improving the accuracy of synchronization even when the frequency of the clock has increased.

The foregoing object is accomplished by providing a synchronizing circuit comprising: a first delay line which includes unit delay elements and transfers a forward pulse signal; a second delay line which includes unit delay elements and transfers a backward pulse signal; and a state holding section which senses the transfer position of the forward pulse signal transferred along the first delay line and controls the backward pulse signal transferred along the second delay line, wherein each of the unit delay elements constituting the first and second delay lines has transistors including first and second transistors, the current driving capability of the first transistors being set higher than that of the second transistors, the first transistors making a response when the signal inputted to the unit delay elements changes from a first level to a second level higher than the first level, and the second transistors making a response when the signal inputted to the unit delay elements changes from the second level to the first level.

With the present invention, the current driving capability of the transistors related to the rising of the pulse signal in the unit delay elements is increased. As a result, the rise time of the pulse signal is made shorter, which improves the accuracy of synchronization, even when the frequency of the clock signal gets higher. In addition, the pulse width of the signal passed through the unit delay elements can be kept constant.

The foregoing object is also accomplished by providing a synchronizing circuit comprising: a first delay line which includes unit delay elements and transfers a forward pulse signal; a second delay line which includes as many unit delay elements as equals half the number of the unit delay elements the first delay line has and which transfers a backward pulse signal; and a state holding section including state holding circuits arranged so as to correspond to the unit delay elements constituting the first and second delay lines, the state holding circuits being set by the forward pulse signal transferred along the first delay line and reset by the backward pulse signal transferred along the second delay line and having a set state in which a pair of adjacent ones of the state holding circuits have been set, a reset state in which a pair of adjacent ones of the state holding circuits have been reset, and an intermediate state in which one of a pair of adjacent ones of the state holding circuits is set and the other of the pair is reset.

With the present invention, the accuracy of synchronization can be improved to half the amount of delay in a unit delay element and a clock signal delayed for half the period can be generated from the inputted clock signal.

Furthermore, the foregoing object is accomplished by providing a synchronizing circuit comprising: a first delay line which includes unit delay elements and transfers a forward pulse signal; a second delay line which includes unit delay elements and transfers a backward pulse signal; and a state holding section including state holding circuits arranged so as to correspond to the unit delay elements constituting the first delay line, the state holding circuits being set according to the forward pulse signal transferred along the first delay line and reset according to the backward pulse signal transferred along the second delay line and having a set state in which n adjacent ones (n is an integer equal to or larger than 2) of the state holding circuits have all been set, a reset state in which all of the n adjacent state holding circuits have been reset, and (n−1) intermediate states in which the n adjacent state holding circuits are either set or reset.

With the present invention, the second clock signal is synchronized with the first clock signal with the accuracy of synchronization of $1/n$ the amount of delay in a unit delay element, which improves the accuracy of synchronization.

Still furthermore, the foregoing object is accomplished by providing a synchronizing circuit comprising: n division circuits for dividing a first clock signal into n signals with an n-fold period (n is an integer equal to or larger than 2); n synchronizing circuits to which the signals divided by the n division circuits are supplied respectively; and a generator circuit for combining the output signals of the n synchronizing circuits and producing a second clock signal with the same period as that of the first clock signal.

With the present invention, the second clock signal is synchronized with the first clock signal with the accuracy of synchronization of $1/n$ the amount of delay in a unit delay element. This makes it possible to improve the accuracy of synchronization more, even when the frequency of the clock signal gets higher.

Moreover, the foregoing object is accomplished by providing a delay circuit comprising: a clocked inverter circuit to which an input pulse signal is supplied; and a logic circuit to which a pulse signal outputted from the clocked inverter circuit and the inverted signal of the input pulse signal are supplied, wherein the clocked inverter circuit changes the pulse width of the input pulse signal in the direction opposite to the direction in which the pulse width of the pulse signal outputted from the logic circuit changes.

In the present invention, the delay circuit is composed of a circuit for widening the pulse width and a circuit for narrowing the pulse width, which prevents the pulse width from getting narrower.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a waveform diagram showing the signals at various sections in FIGS. 1 to 4;

FIG. 6 shows the configuration of a synchronizing circuit according to a second embodiment of the present invention;

FIGS. 7A and 7B schematically show the operation of the state holding section of FIG. 6;

FIGS. 8A, 8B, and 8C schematically show the operation of the state holding section of FIG. 6;

FIGS. 20A to 20E show structures to explain a state holding section according to a fourth embodiment of the present invention;

FIG. 21 shows the configuration of part of the synchronizing circuit according to the fourth embodiment;

DETAILED DESCRIPTION OF THE INVENTION

Hereinafter, referring to the accompanying drawings, embodiments of the present invention will be explained.

First Embodiment

In a first embodiment of the present invention, the amount of delay in a unit delay element directly related to the accuracy of synchronization is decreased to improve the accuracy of synchronization of an internal clock signal synchronized with an external clock signal.

Figure 1:
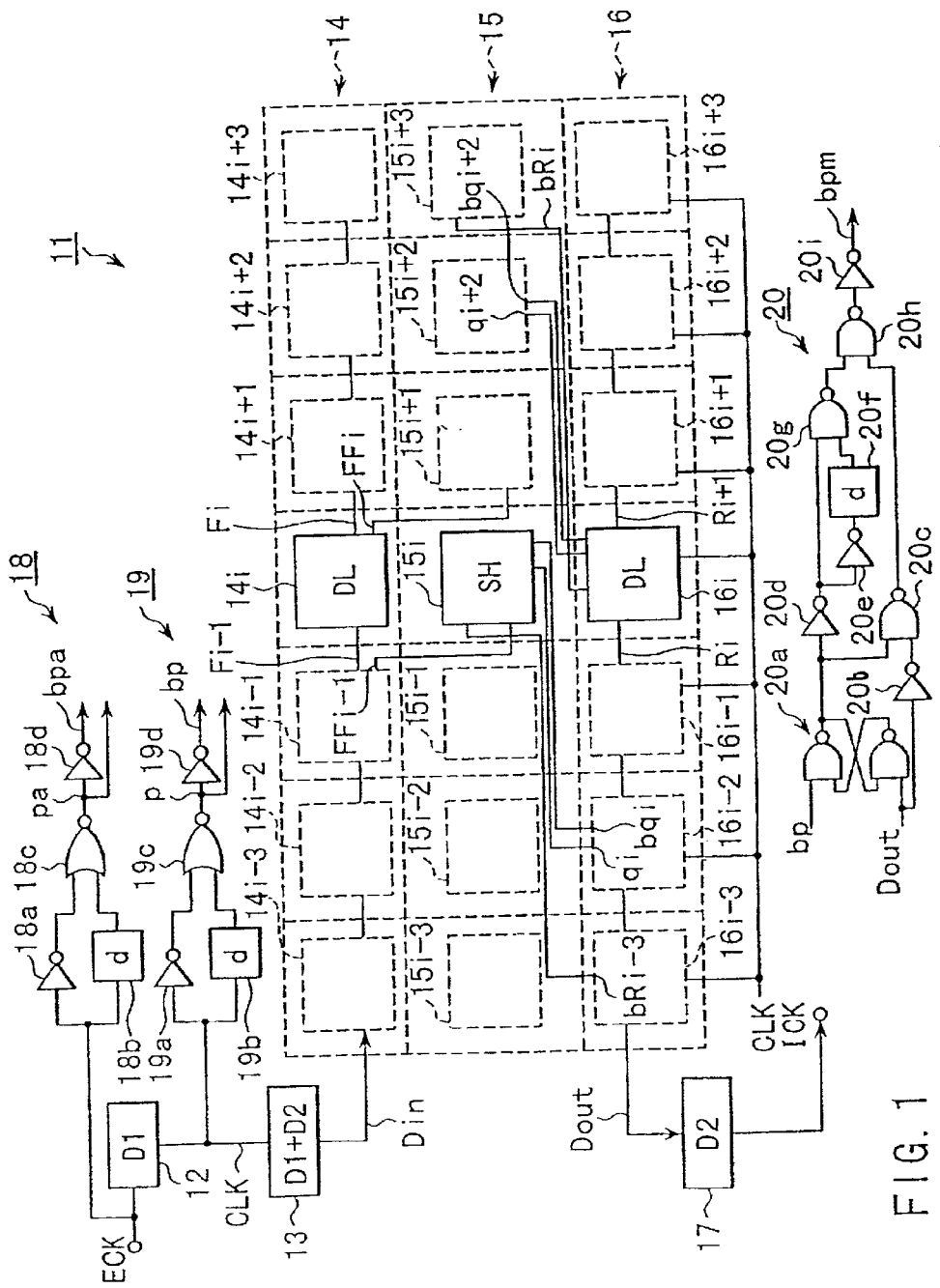
FIG. 1 shows the configuration of a SAD synchronizing circuit applied to a first embodiment of the present invention.

FIG. 1 shows a SAD synchronizing circuit 11 applied to the first embodiment. An external clock signal ECK is supplied to a delay monitor 13 via an input buffer circuit 12 with a delay time of D1. The delay monitor 13 has a delay time of D1+D2, which is the sum of the delay time D1 of the input buffer circuit 12 and the delay time D2 of an output buffer circuit explained later. The output signal Din of the delay monitor 13 is supplied to a first delay line 14 acting as a forward pulse delay line. The first delay line 14 is composed of unit delay elements (DL) 14$i$-3, . . . , 14$i$, . . . , 14$i$+3 connected in series.

Near the first delay line 14, a second delay line 16 acting as a backward pulse delay line is provided. The second delay line 16 is composed of unit delay elements (DL) 16$i$−3, ..., 16$i$, ..., 16$i$+3 connected in series. A state holding section 15 is provided between the first and second delay lines 14, 16. The state holding section 15 is composed of state holding circuits 15$i$−3, ..., 15$i$, ..., 15$i$+3 provided in such a manner that they correspond to the individual unit delay elements constituting the first and second delay lines 14, 16. The state holding circuits 15$i$−3, ..., 15$i$, ..., 15$i$+3 are set in sequence according to the pulse signal transferred to the first delay line 14 and are reset in sequence according to the pulse signal transferred to the second delay line 16. In the set state, the state holding circuits connect the unit delay elements constituting the second delay line 16, whereas in the reset state, the state holding circuits separate the unit delay elements of the second delay line 16. A clock signal CLK is supplied to each of the unit delay elements 16$i$−3, ..., 16$i$, ..., 16$i$+3 constituting the second delay line 16. The output buffer circuit 17 is connected to the output terminal of the second delay line 16. The output buffer circuit 17 outputs an internal clock signal ICK synchronizing with the external clock signal ECK at its output terminal.

The external clock signal ECK is supplied to a first signal generator circuit 18. The first signal generator circuit 18 is composed of an inverter circuit 18$a$, a delay circuit 18$b$ with a delay time of d, a NOR circuit 18$c$ to which the output signals of the inverter circuit 18$a$ and delay circuit 18$b$ are supplied and which outputs a signal pa, and an inverter circuit 18$d$ to which the signal pa is supplied and which outputs an inverted signal bpa (hereinafter, "b" at the head of a reference symbol means an inverted signal).

The clock signal CLK outputted from the input buffer 12 is supplied to a second generator circuit 19. The second signal generator circuit 19 is composed of an inverter circuit 19$a$, a delay circuit 19$b$ with a delay time of d, a NOR circuit 19$c$ to which the output signals of the inverter circuit 19$a$ and delay circuit 19$b$ are supplied and which outputs a signal p, and an inverter circuit 19$d$ to which the signal pa is supplied and which outputs an inverted signal bp.

The signal bp outputted from the second signal generator circuit 19 and the output signal Dout of the second delay line 16 are supplied to a third generator circuit 20. The third signal generator circuit 20 is composed of a flip-flop circuit 20$a$ to which the signals bp and Dout are supplied, an inverter circuit 20$b$ to which the signal Dout is supplied, a NAND circuit 20$c$ to which the output signal of the inverter circuit 20$b$ and the output signal of the flip-flop circuit 20$a$ are supplied, an inverter circuit 20$d$ to which the output signal of the flip-flop circuit 20$a$ is supplied, an inverter circuit 20$e$ to which the output signal of the inverter circuit 20$d$ is supplied, a delay circuit 20$f$ with a delay time of d, a NAND circuit 20$g$ to which the output signal of the delay circuit 20$f$ and the output signal of the inverter circuit 20$d$ are supplied, a NAND circuit 20$h$ to which the output signals of the NAND circuit 20$g$ and NAND circuit 20$c$ are supplied, and an inverter circuit 20$i$ to which the output signal of the NAND circuit 20$h$ is supplied and which outputs a signal bpm.

The signals pa and bpa outputted from the first signal generator circuit 18, the signals p and bp outputted from the second signal generator circuit 19, and the signal bpm outputted from the third signal generator circuit 20 are supplied to the first and second delay lines 14, 16 and state holding section 15.

Figure 2A:
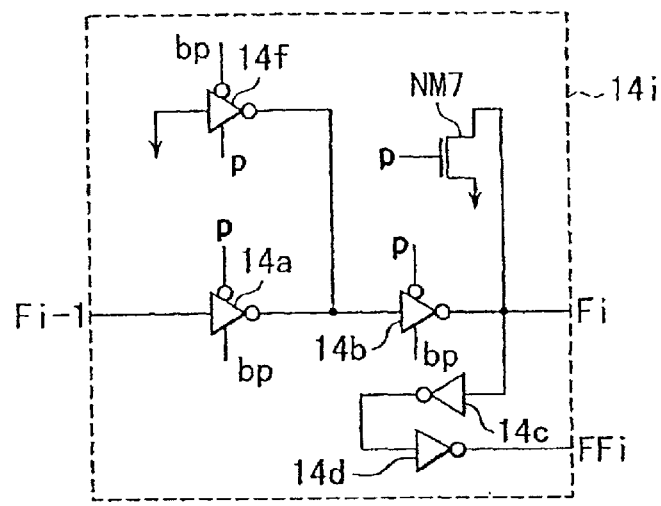
FIGS. 2A, 2B, and 2C are circuit diagrams of part of a first and a second delay line and a state holding section shown in FIG. 1.
Figure 2B:
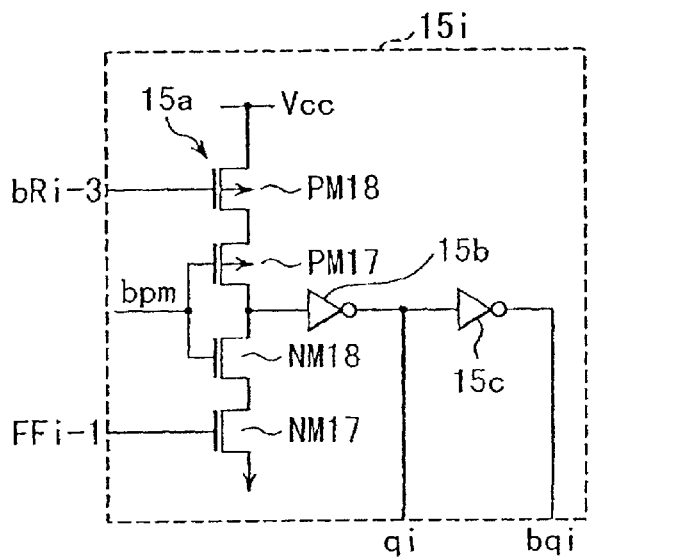
Figure 2C:
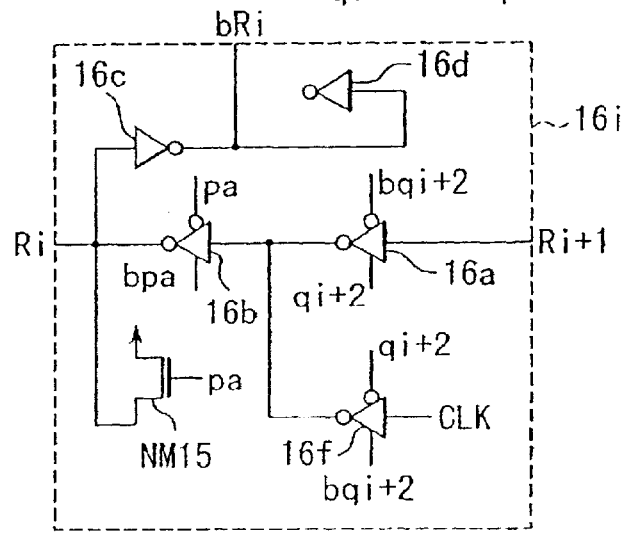

FIGS. 2A, 2B and 2C show the configuration of the unit delay elements 14$i$ and 16$i$ and state holding circuit 15$i$ at the i-th stage in the first and second delay lines 14, 16 and state holding section 15. The unit delay element 14$i$ is composed of clocked inverter circuits 14$a$, 14$b$ connected in series, inverter circuits 14$c$, 14$d$ connected in series with the output terminal of the clocked inverter circuit 14$b$, an n-channel MOS transistor (hereinafter, referred to as an NMOS transistor) NM7 which is connected between the output terminal of the clocked inverter circuit 14$b$ and the ground and to whose gate a signal p is supplied, and a clocked inverter circuit 14$f$ whose input terminal is grounded and whose output terminal is connected to the input terminal of the clocked inverter circuit 14$b$.

The clocked inverter circuits 14$a$, 14$b$, 14$f$ are controlled by the signals p and bp. The signal Fi−1 outputted from the unit delay element 14$i$−1 at the (i−1)-th stage is supplied to the input terminal of the clocked inverter circuit 14$a$. The clocked inverter circuit 14$b$ outputs a signal Fi at its output terminal. The inverter circuit 14$d$ outputs a signal FFi. The signals Fi and FFi are supplied to the unit delay element 14$i$+1 and state holding circuit 15$i$+1, respectively.

The state holding circuit 15$i$ is composed of a clocked inverter circuit 15$a$ and inverter circuits 15$b$, 15$c$ connected in series. The clocked inverter 15$a$ is composed of p-channel MOS transistors (hereinafter, referred to as PMOS transistors) PM18 and PM17 and NMOS transistors NM18 and NM17 whose current paths are connected in series between a power supply Vcc and the ground.

The signal bRi−3 outputted from the unit delay element 16$i$−3 at the (i−3)-th stage constituting the second delay line 16 is supplied to the gate of the PMOS transistor PM18. The signal bpm is supplied to the gates of the PMOS transistor PM17 and NMOS transistor NM18. The signal FFi−1 supplied from the unit delay element 14$i$−1 at the (i−1)-th stage constituting the first delay line 14 is supplied to the gate of the NMOS transistor NM17. The inverter circuit 15$b$ outputs a signal qi at its output terminal and the inverter circuit 15$c$ outputs a signal bqi at its output terminal. These signals qi and bqi are supplied to a unit delay element 16$i$−2 constituting the second delay line 16.

The unit delay element 16$i$ is composed of clocked inverter circuits 16$a$, 16$b$ connected in series, inverter circuits 16$c$, 16$d$ connected in series with the output terminal of the clocked inverter circuit 16$b$, an NMOS transistor NM15 which is connected between the output terminal of the clocked inverter circuit 16$b$ and the ground and to whose gate the signal pa is supplied, and a clocked inverter circuit 16$f$ to whose input terminal the signal CLK is supplied and whose output terminal is connected to the input terminal of the clocked inverter circuit 16$b$.

The clocked inverter circuits 16$a$ and 16$f$ are controlled by signals qi+2 and bqi+2. The clocked inverter circuit 16$b$ is controlled by the signals pa, bpa. The signal Ri+1 outputted from the unit delay element 16$i$+1 at the (i+1)-th stage is supplied to the input terminal of the clocked inverter circuit 16$a$. The clocked inverter circuit 16$b$ outputs a signal Ri at its output terminal. The inverter circuit 16$c$ outputs a signal bRi. The signal Ri is supplied to the unit delay element 16$i$−1 and the signal bRi is supplied to the state holding section 15$i$+2. The inverter circuit 16$d$ is a dummy inverter circuit corresponding to the inverter circuit 14$d$ constituting the unit delay element 14$i$.

Figure 3:
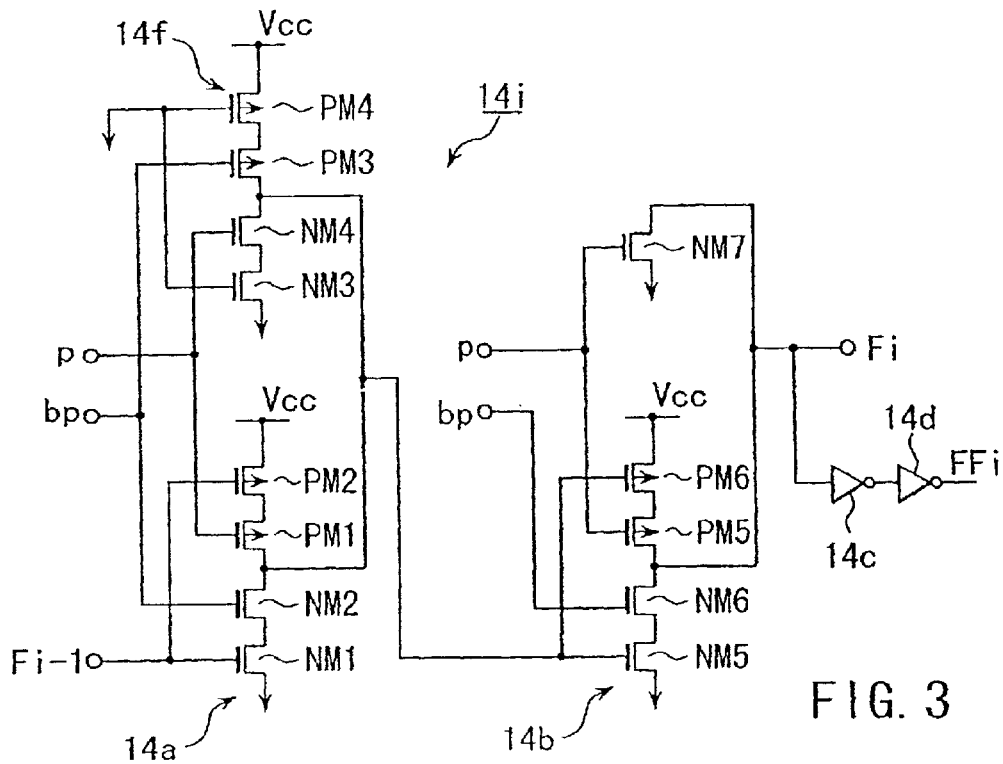
FIG. 3 is a circuit diagram showing a unit delay element of FIG. 2A.
Figure 4A:
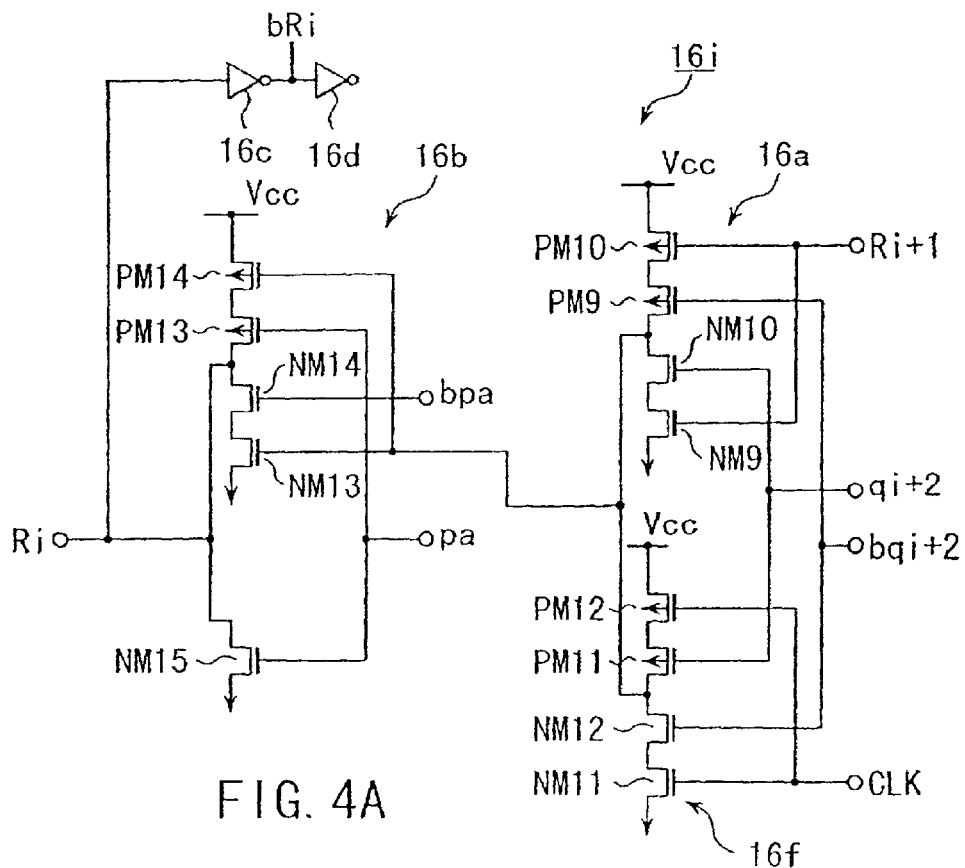
FIG. 4A is a circuit diagram showing a unit delay element of FIG. 2C, and FIGS. 4B, 4C, and 4D are plan views to explain a method of setting the current driving capability of each transistor.

FIG. 3 is a circuit diagram of the unit delay element 14$i$ shown in FIG. 2A. FIG. 4A is a circuit diagram of the unit delay element 16$i$ shown in FIG. 2C. In FIGS. 3 and 4A, the same parts as those in FIGS. 2A and 2C are indicated by the same reference symbols.

In FIG. 3, the clocked inverter circuit 14a is composed of PMOS transistors PM2, PM1 and NMOS transistors NM2, NM1 whose current paths are connected in series between the power supply Vcc and the ground. The clocked inverter circuit 14f is composed of PMOS transistors PM4, PM3 and NMOS transistors NM4, NM3 whose current paths are connected in series between the power supply Vcc and the ground. The clocked inverter circuit 14b is composed of PMOS transistors PM6, PM5 and NMOS transistors NM6, NM5 whose current paths are connected in series between the power supply Vcc and the ground.

In FIG. 4A, the clocked inverter circuit 16a is composed of PMOS transistors PM10, PM9 and NMOS transistors NM10, NM9 whose current paths are connected in series between the power supply Vcc and the ground. The clocked inverter circuit 16f is composed of PMOS transistors PM12, PM11 and NMOS transistors NM12, NM11 whose current paths are connected in series between the power supply Vcc and the ground. The clocked inverter circuit 16b is composed of PMOS transistors PM14, PM13 and NMOS transistors NM14, NM13 whose current paths are connected in series between the power supply Vcc and the ground.

FIGS. 2A to 4A show the configuration of the unit delay elements 14i, 16i, and state holding circuit 15i at the i-th stage. Each of the unit delay elements and state holding circuits at a stage other than the i-th stage has the same configuration, with the relationship between the signal input and output being the same as that at the i-th stage.

FIG. 5 shows the signals at various sections in FIGS. 1 to 4A. In the SAD synchronizing circuit of FIG. 1, the input buffer circuit 12 generates a signal CLK that lags behind by D1 from the external clock ECK with the period T. The signal CLK is delayed for D1+D2 by the delay monitor 13 and the resulting signal is supplied to the first delay line 14. The individual unit delay elements 14i–3, . . . , 14i, . . . , 14i+3 constituting the first delay line 14 transfer a signal Din as a forward pulse signal according to the signals p and bp outputted from the second signal generator circuit 19.

Each of the state holding circuits constituting the state holding section 15 is set, depending on the signal bpm supplied from the fourth signal generator circuit 20 and the output signal from the unit delay element at the preceding stage. Specifically, the state holding circuits are brought to the set state, when the forward pulse signal passes through the first delay line 14.

When the state holding circuits are in the set state, the unit delay elements of the second delay line 16 output the backward pulse signal from the preceding stage to the next stage. When the state holding circuits are in the reset state, the unit delay elements do not accept the signal from the preceding stage but propagate the clock signal CLK supplied in common. Specifically, the second delay line 16 transfers a backward pulse signal or clock signal CLK according to the signals qi+2, bqi+2 supplied from the state holding circuit two stages ahead and the signals pa, bpa supplied from the signal generator circuit 18. When the backward pulse signal passes through the second delay line 16, the corresponding state holding circuit is brought into the reset state. The output signal Dout of the second delay line 16 is outputted via the output buffer circuit 17, thereby generating an internal clock signal ICK. As a result, the internal clock signal ICK lags behind from the external clock signal ECK as follows:

$$D1+(D1+D2)+2(T-(D1+D2))+D2=2T$$

Consequently, the internal clock signal ICK synchronizes with the external clock signal ECK.

In the SAD synchronizing circuit, synchronization is established by the rising of the pulse signal. Therefore, the amount of delay in the unit delay element can be decreased by enhancing the current driving capability of the transistor related to the rising of the pulse signal (the transistor that responds when the signal supplied to a circuit changes from the high to low level). Specifically, in the unit delay elements 14i, 16i shown in FIGS. 3 and 4A, the transistors related to the rising of the pulse signal include the NMOS transistors NM1, NM2, NM3, NM4 and PMOS transistors PM5, PM6 for forward pulses and the NMOS transistors NM9, NM10, NM11, NM12 and PMOS transistors PM13, PM14 for backward pulses. Thus, the current driving capability can be increased by widening, for example, the channel width of each of these transistors.

Figure 4B:
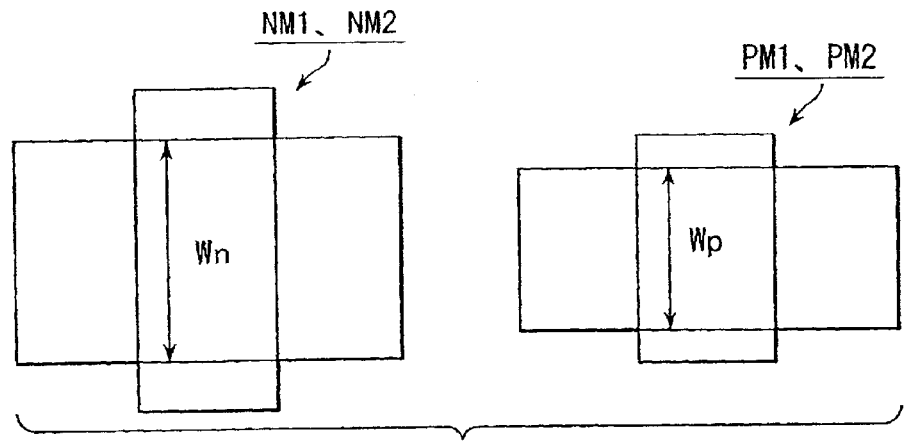
Figure 4C:
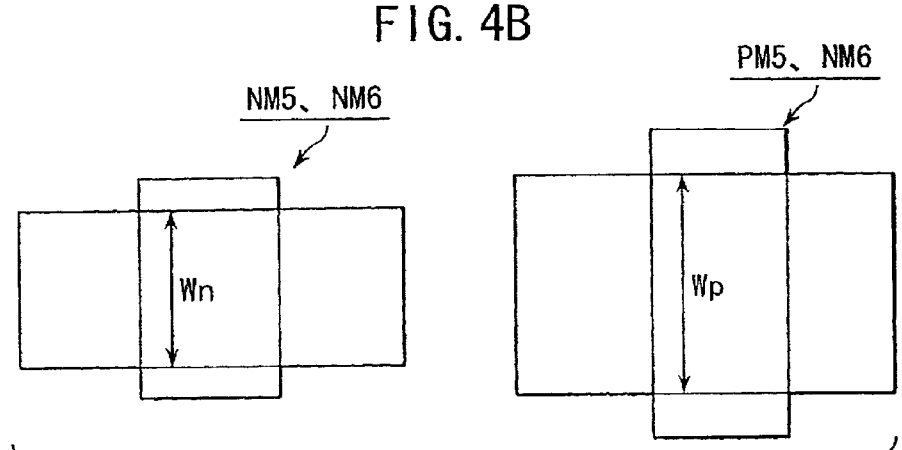

When the ratio of the current driving capability of the NMOS transistors to that of the PMOS transistors is 2:1, the ratio of the channel width of the former to that of the latter is normally set to 1:2. As a result, the current driving capability of the NMOS transistors is made equal to that of the PMOS transistors. In contrast, in the first embodiment, the ratio of, for example, the channel width of the NMOS transistors NM1, NM2 to that of the PMOS transistors PM1, PM2 is set equal to or less than, for example, Wn:Wp=1:2 as shown in FIG. 4B. In addition, the ratio of the channel width of the PMOS transistors NM5, NM6 to that of the NMOS transistors NM5, NM6 is set equal to or greater than, for example, Wn:Wp=1:2 as shown in FIG. 4C.

Use of this configuration increases the current driving capability but permits the gate capacity to increase. The increased gate capacity can be canceled by making smaller the channel width of each of the PMOS transistors PM1, PM2, PM3, PM4, NMOS transistors NM5, NM6, and PMOS transistors PM9, PM10, PM11, PM12, PM13, and PM14 related to the falling of the pulse signal. As a result, the falling response speed of the pulse signal outputted from the clocked inverter circuit gets faster and the rising response speed of the same pulse signal gets slower than the pulse signal inputted to the clocked inverter circuit. This causes a problem: the pulse width increases each time the pulse passes through the unit delay element. However, control is performed so that the pulse signal from this time on may not be propagated, by causing the signals p and bp to control the clocked inverter circuit 14b (NM5, NM6, PM5, PM6) and the signals pa, bpa to control the clocked inverter circuit 16b. This prevents the pulse width from increasing.

The configuration for changing the current driving capability is not limited to the case where the channel width is changed. For instance, the same configuration can be realized by changing the channel length, the threshold voltage of the transistor, or the substrate voltage.

Figure 4D:
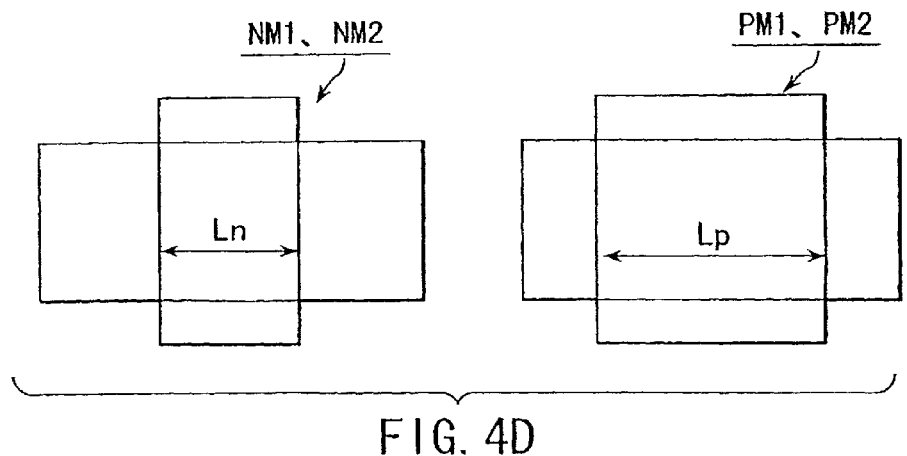

As shown in FIG. 4D, when the channel length is changed, for example, the channel length Lp of the PMOS transistors PM1, PM2 is made longer than the channel length Ln of the NMOS transistors NM1, NM2. Further, the channel length of the PMOS transistors PM5 and PM6 is made shorter than that of the NMOS transistors NM5 and NM6.

When the threshold voltage of the transistor is changed, the threshold voltage of the NMOS transistor is made lower than usual and the threshold voltage of the PMOS transistor is made higher than usual. One of the methods of changing the threshold voltage is to control the concentration of impurities implanted into the channel region.

When the substrate voltage or well voltage is changed, the backgating bias of the PMOS transistor is made higher than the backgating bias of the NMOS transistor.

This setting makes the rising of the pulse faster.

With the first embodiment, the current driving capability of the transistors related to the rising of the pulse signal in each unit delay element constituting the first and second delay lines 14, 16 (or the transistors that respond when the signal supplied to a circuit changes from the high to low level) is increased. As a result, the rise time of the pulse signal can be made shorter, shortening the delay time required for the pulse signal to rise, which improves the accuracy of synchronization.

Furthermore, the clocked inverter circuits in the first and second delay elements are controlled by the specific control signals p, bp, pa, bpa, thereby forcing the pulse signal to fall. This prevents the pulse signal with an increased pulse width from being propagated to the next stage.

Second Embodiment

In a second embodiment of the present invention, a case where an internal clock signal is shifted half the period from an external clock signal will be explained.

The second embodiment differs from the first embodiment chiefly in that the amount of delay in the second delay line is made greater by giving an intermediate potential to the second delay line 16.

FIG. 6 shows the configuration of a synchronizing circuit according to the second embodiment. In FIG. 6, the same parts as those in the first embodiment are indicated by the same reference symbols. In FIG. 6, a delay monitor 31 has a delay time (2(D1+D2)) of twice the sum of the delay time of the input buffer circuit 12 and that of the output buffer circuit 17. The number of unit delay elements of the second delay line 16 is set to half the number of the unit delay elements of the first delay line 14. The unit delay elements of the second delay line 16 are arranged for every other unit delay element constituting the first delay line 14. Specifically, in the synchronizing circuit, a backward pulse signal advancing along the second delay line 16 is allowed to propagate along as many unit delay elements as equals half the number of unit delay elements along which the forward pulse advanced along the first delay line 14. This causes the internal clock signal to be synchronized with the external clock signal in such a manner that the former is shifted half the period from the latter.

FIGS. 7A and 7B schematically show the operation of the state holding section 15 shown in FIG. 6. In FIGS. 7A and 7B, "S" represents the set state. When a forward pulse passes through the state holding section, it is brought into the set state. In the set state, a unit delay element for backward pulse signals outputs the backward pulse from the preceding stage to the next stage. In addition, "R" indicates the reset state. When a backward pulse passes through the state holding section, it is brought into the reset state. With the state holding section in the reset state, a unit delay element for backward pulse signals does not accept the signal from the preceding stage but propagates the clock signal inputted in common.

As shown in FIGS. 7A and 7B, in the synchronizing circuit that achieves synchronization by shifting the internal clock half the period, only half of the information about the setting and resetting of the state holding circuit is used, which is a waste of information. To avoid the wasting a pair of adjacent state holding circuits is used to set a piece of information.

Specifically, as shown in FIGS. 8A, 8B, and 8C, a case where a pair of state holding circuits are set is defined as "S", whereas a case where a pair of state holding circuits is reset is defined as "R". In addition, as shown in FIG. 8B, a case where a pair of state holding circuits are set and reset is defined as an intermediate state "M". Namely, the state holding section is designed to have ternary information. In the intermediate state "M," the amount of delay in a unit delay element constituting the second delay line is halved. Since it is difficult to halve the amount of delay in the unit delay elements, the pair of state holding circuits does not accept the input from the preceding stage but propagates the clock signal CLK inputted in common in the intermediate state "M" as in the reset "R". In this case, the amount of delay in the unit delay elements constituting the second delay line 16 is made 1.5 times the amount of delay in the unit delay elements constituting the first delay line 14. With this configuration, the accuracy of synchronization can be improved to half the amount of delay in the unit delay elements, which will be explained later in detail.

Figure 9:
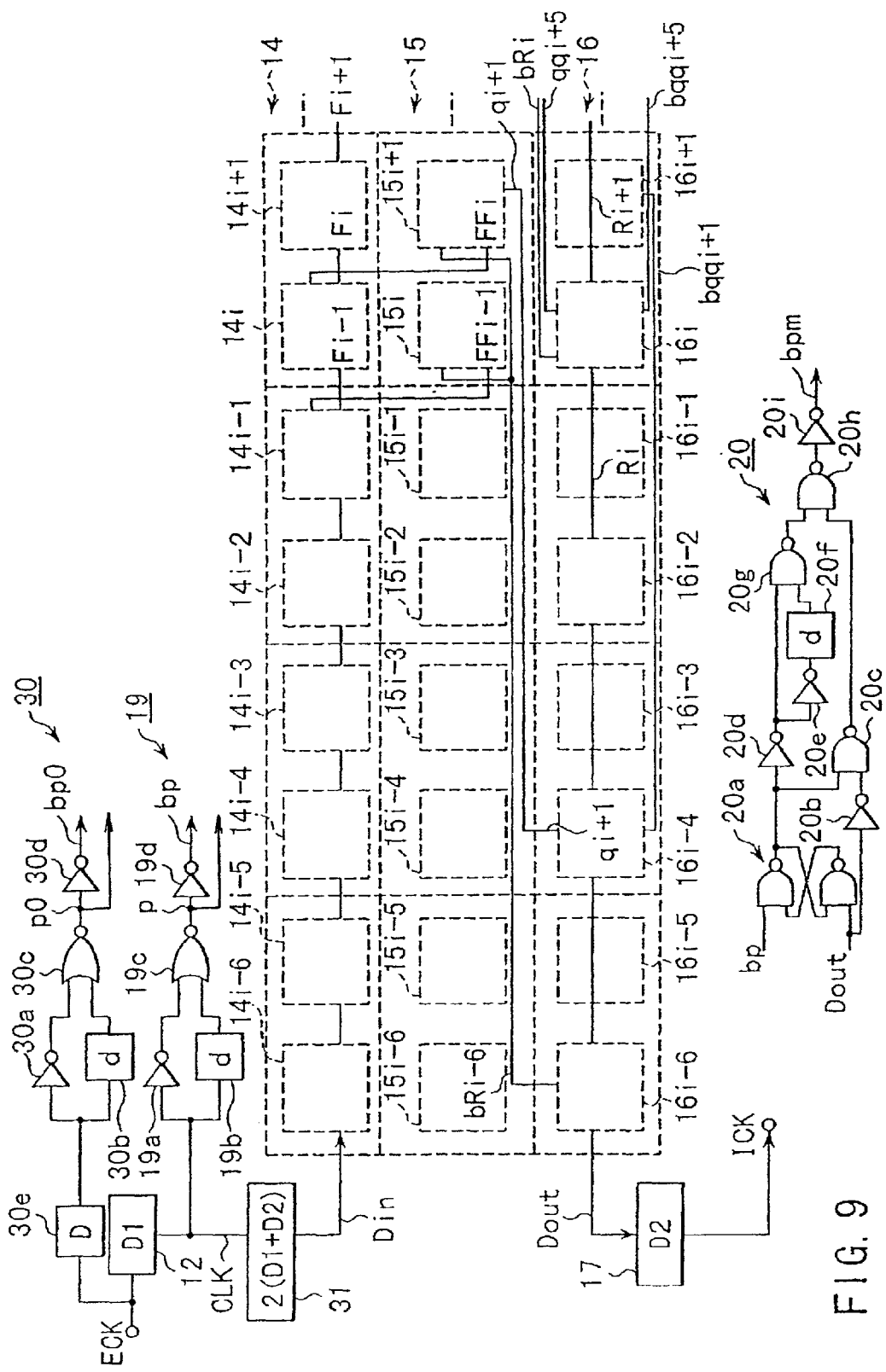
FIG. 9 shows the configuration of FIG. 6.

FIG. 9 shows a configuration of FIG. 6. In FIG. 9, the same parts as those in FIGS. 1 and 6 are indicated by the reference symbols and only the parts differing from FIGS. 1 and 6 will be explained. In the first delay line 14, state holding circuit 15, and second delay line 16, two adjacent circuits form a pair. In the second delay line 16, the unit delay elements 16$i$–6, 16$i$–4, 16$i$–2, 16$i$, . . . and the signal generator circuits 16$i$–5, 16$i$–3, 16$i$–1, 16$i$+1, . . . for controlling the unit delay elements 16$i$–6, 16$i$–4, 16$i$–2, 16$i$, are arranged alternately.

A first signal generator circuit 30 is composed of a buffer circuit 30$e$ with a delay time of D, an inverter circuit 30$a$, a delay circuit 30$b$ with a delay time of d, an OR circuit 30$c$, and an inverter circuit 30$d$. The first signal generator circuit 30 generates signals p0 and bp0 from the signal delayed by the buffer circuit 30$e$ for the delay time D. The pulse width of the signal p0 and bp0 is set almost equal to the amount of delay in a unit delay element.

Figure 10:
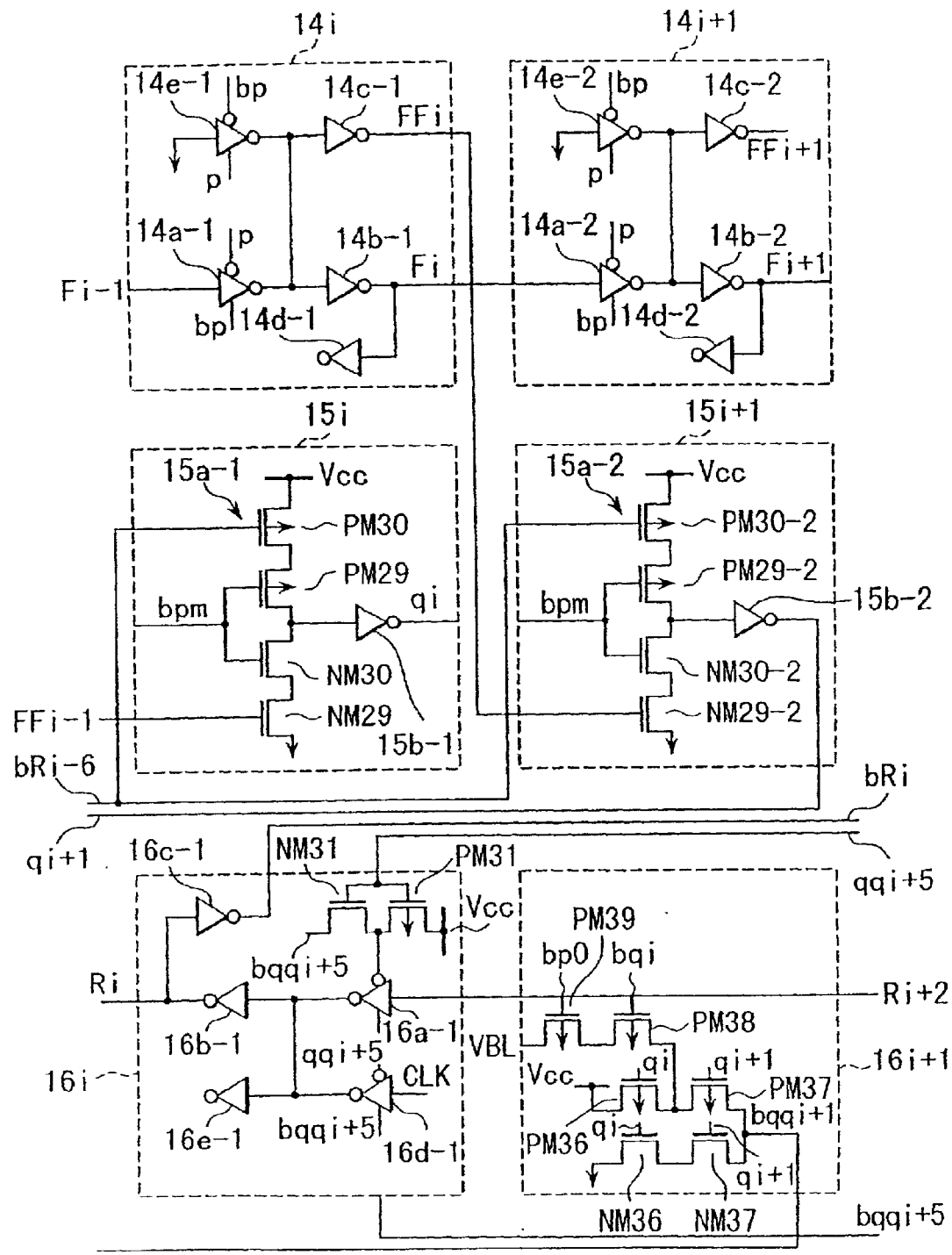
FIG. 10 is a circuit diagram of part of FIG. 9.

FIG. 10 shows the unit delay elements 14$i$, 14$i$+1, 16$i$, state holding circuits 15$i$, 15$i$+1, and signal generator circuit 16$i$+1 at the i-th stage and the (i+1)-th stage of FIG. 9.

The unit delay element 14$i$ is composed of a clocked inverter circuit 14$a$–1, an inverter circuit 14$b$–1 connected in series with the inverter circuit 14$a$–1, an inverter circuit 14$d$–1 connected in series with the output terminal of the inverter circuit 14$b$–1, an inverter circuit 14$c$–1 connected to the output terminal of the clocked inverter circuit 14$a$–1, and a clocked inverter circuit 14$e$–1 whose input terminal is grounded and whose output terminal is connected to the input terminal of the inverter circuit 14$b$–1. The clocked inverter circuits 14$a$–1, 14$e$–1 are controlled by the signals p and bp. The signal Fi–1 outputted from the unit delay element 14$i$–1 at the (i–1)-th stage is supplied to the input terminal of the clocked inverter circuit 14$a$–1. The inverter circuit 14$b$–1 outputs a signal Fi at its output terminal. In addition, the inverter circuit 14$c$–1 outputs a signal FFi. The signals Fi and FFi are supplied to the unit delay elements 14$i$+1 and the state holding circuit 15$i$+1, respectively. The inverter circuit 14$d$–1 is a dummy inverter corresponding to the inverter circuit 16$c$–1 provided in the unit delay element 16$i$ explained later.

The unit delay elements 14$i$+1 has almost the same configuration as that of the unit delay element 14$i$. The same parts as those in the unit delay elements 14$i$ are suffixed with "–2" and explanation will be omitted.

The state holding section 15$i$ is composed of a clocked inverter circuit 15$a$–1 and an inverter circuit 15$b$–1 connected in series. The clocked inverter circuit 15$a$–1 is composed of PMOS transistors PM30, PM29 and NMOS transistors NM30, NM29 connected in series between a power supply Vcc and the ground. The signal bRi–6 outputted from the unit delay element 16$i$+–6 at the (i–6)-th stage constituting the second delay line 16 is supplied to the gate of the PMOS transistor PM30. The signal bpm is supplied to the gates of the PMOS transistor PM29 and the NMOS transistor NM30. The signal FFi−1 supplied from the unit delay element 14i−1 at the (i−1)-th stage constituting the first delay line 14 is supplied to the gate of the NMOS transistor NM29. The inverter circuit 15b−1 outputs a signal qi at its output terminal.

The state holding circuit 15i+1 has almost the same configuration as that of the state holding circuit 15i. The same parts as those in the state holding circuit 15i are suffixed with "−2" and explanation will be omitted.

The unit delay element 16i is composed of a clocked inverter circuit 16a−1, an inverter circuit 16b−1 connected in series with the clocked inverter circuit 16a−1, an inverter circuit 16c−1 connected to the output terminal of the inverter circuit 16b−1, a clocked inverter circuit 16d−1 to whose input terminal the signal CLK is supplied and whose output terminal is connected to the input terminal of the inverter circuit 16b−1, an inverter circuit 16e−1 connected to the output terminal of the clocked inverter circuit 16a−1, and a PMOS transistor PM31 and an NMOS transistor NM31 whose current paths are connected in series.

The PMOS transistor PM31 and NMOS transistor NM31 output a signal bqqi+5 according to the signal qqi+5 supplied from the signal generator circuit at the (i+5)-th stage (not shown). The clocked inverter circuit 16a−1 is controlled by the signals bqqi+5, qqi+5 and the clocked inverter circuit 16d−1 is controlled by the signals qqi+5, bqqi+5. The signal Ri+2 outputted from the unit delay element at the (i+2)-th stage (not shown) is supplied to the input terminal of the clocked inverter circuit 16a−1. The inverter circuit 16b−1 outputs a signal Ri at its output terminal. In addition, the inverter circuit 16c−1 outputs a signal bRi. The inverter circuit 16e−1 is a dummy inverter circuit corresponding to the inverter circuit 14c−1 constituting the unit delay element 14i.

The signal controlling the PMOS transistor PM31, NMOS transistor NM31, and clocked inverter circuit 16d−1 is not limited to the output signal of the signal generator circuit at the (i+5)-th stage. The output signal of the signal generator circuit at another stage may be used instead.

The signal generator circuit 16i+1 is composed of PMOS transistors PM36, PM37 and NMOS transistors NM37, NM36 connected in series between the power supply Vcc and the ground and PMOS transistors PM38, PM39 whose current paths are connected in series with the connection node of the PMOS transistors PM36, PM37.

The output signal qi of the state holding circuit 15i is supplied to the gates of the PMOS transistor PM36 and NMOS transistor NM36. The output signal qi+1 of the state holding circuit 15i+1 is supplied to the gates of the PMOS transistor PM37 and NMOS transistor NM37. The signal pb0 outputted from the first signal generator circuit 30 is supplied to the gate of the PMOS transistor PM39, to one end of whose current path a voltage VBL is applied. In addition, the signal bqi is supplied to the gate of the PMOS transistor PM38. A signal bqqi+1 is outputted at the connection node of the PMOS transistor PM37 and NMOS transistor NM37. The signal bqqi+1 is supplied to the unit delay element 16i−4.

Figure 11:
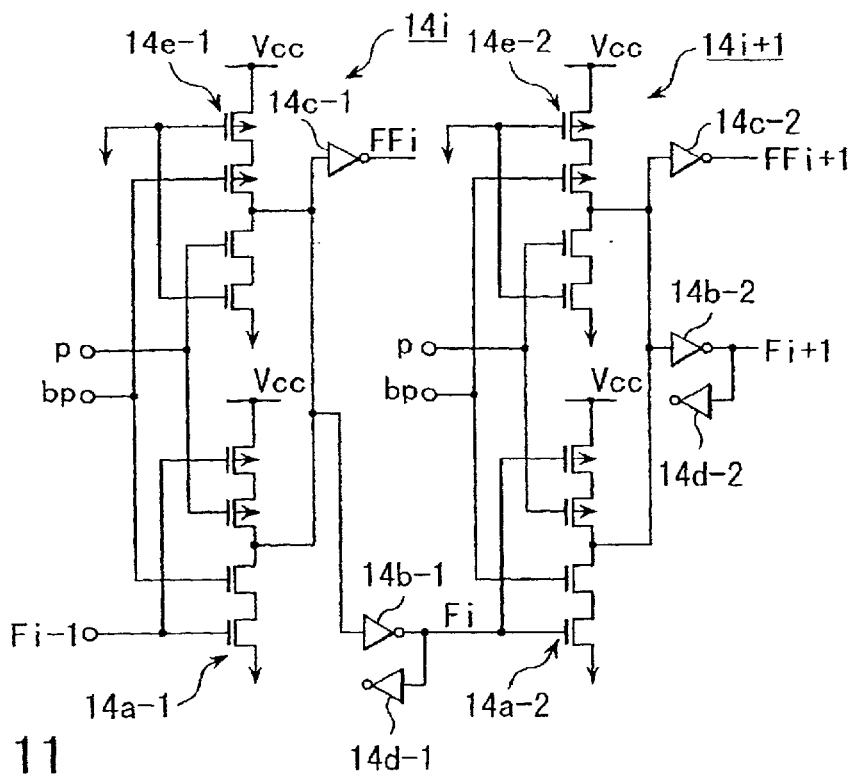
FIG. 11 is a circuit diagram showing a unit delay element in FIG. 10.
Figure 12:
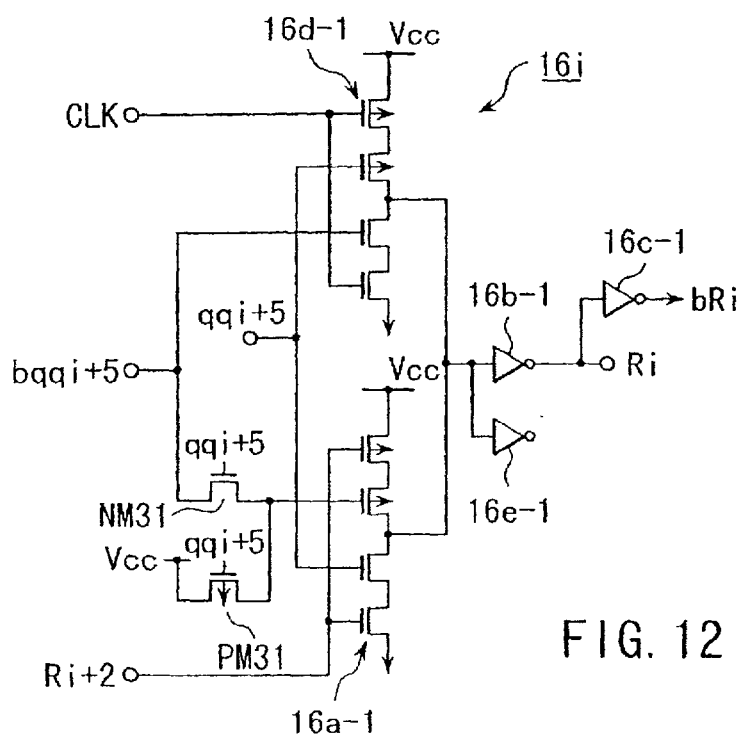
FIG. 12 is a circuit diagram showing a unit delay element in FIG. 10.

FIG. 11 is a circuit diagram of the unit delay elements 14i, 14i+1. FIG. 12 is a circuit diagram of the unit delay elements 16i and 16i+1. In FIGS. 11 and 12, the same parts as those in FIG. 10 are indicated by the same reference symbols.

In the above configuration, when both of the output signals qi and qi+1 of the adjacent state holding circuits 15i and 15i+1 are at the high level, or when a pair of state holding circuits are in the set state, the output signal bqqi+1 of the signal generator circuit 16i+1 goes low. When both of the output signals qi and qi+1 are at the low level, or when a pair of state holding circuits are in the reset state, the output signal bqqi+1 of the signal generator circuit 16i+1 goes high. Furthermore, when the signal qi of the outputs of a pair of state holding circuits is at the high level, the signal qi+1 is at the low level, and the output signal bp0 of the first signal generator circuit 30 is at the low level, or when the pair are in the intermediate state "M," the output signal bqqi+1 of the signal generator circuit 16i+1 is brought to the level of voltage VBL.

The output signal bqqi+5 of the signal generator circuit at the (i+5)-th stage (not shown) supplied to the unit delay element 16i is set high or low, depending on the output signal of the state holding circuits at the (i+4)-th stage and the (i+5)-th stage as described above.

In the unit delay element 16i, the clocked inverter circuit 16a−1 and inverter circuit 16b−1 form a path, when the pair of state holding circuits are in the set state. The backward pulse signal supplied from the preceding stage is propagated via the path to the next stage.

When the pair of state holding circuits are in the reset state, the clocked inverter circuit 16a−1 is made nonconducting and the clocked inverter circuit 16d−1 is made conducting. As a result, the backward pulse signal from the preceding stage is cut off and the clock signal CLK is transferred to a subsequent stage.

On the other hand, as described above, in the intermediate state "M," the signal qi of the output signals of the pair of state holding circuits is at the high level, the signal qi+1 is at the low level, and the output bp0 of the first signal generator circuit 30 is at the low level. At this time, the output signal bqqi+1 of the signal generator circuit 16i+1 is at the level of voltage VBL. The voltage VBL is a potential that lowers the current driving capability of the NMOS transistor of the clocked inverter circuit 16d−1 allowing the clock signal CLK to pass through. The voltage VBL is set at about 1.0 V, when the potential of the signal bqi+1 is set at, for example, 1.8 V in the reset state and at 0 V in the set state. By setting the voltage VBL this way, the clock signal is delayed 1.5 times the amount of delay in the clock signal CLK in the reset state.

Figure 13:
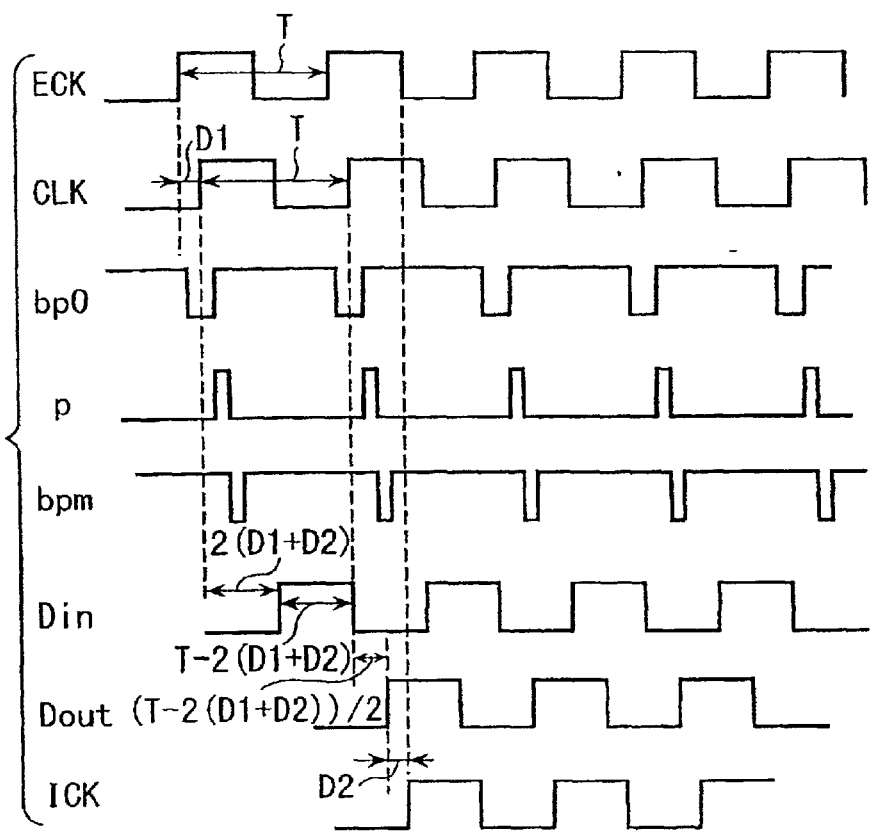
FIG. 13 is a waveform diagram showing the operations of FIGS. 9 to 12.

As shown in FIG. 13, the signal bp0 is a signal that falls immediately before the clock signal CLK rises and rises immediately after the clock signal CLK rises. Specifically, the pulse width of the signal bp0 is set to a value corresponding to about the amount of delay in a unit delay element. As a result, the signal bqqi+1(bqqi+5) is at the voltage VBL, only when the signal bp0 is at the low level.

Figure 14A:
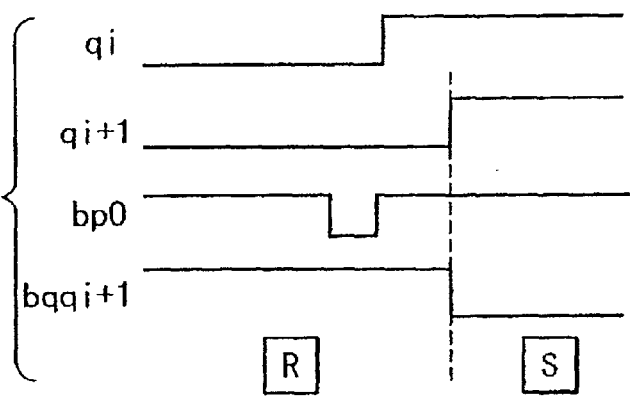
FIGS. 14A and 14B are diagrams to help explain intermediate state "M"

Specifically, as the forward pulse signal is propagated along the first delay line 14, the output signals of a pair of adjacent state holding circuits often go high and low. As shown in FIG. 14A, however, in a case where the output signals qi, qi+1 of a pair of adjacent state holding circuits both go high or low, when the signal bp0 is not generated, the intermediate state "M" will not appear.

Figure 14B:
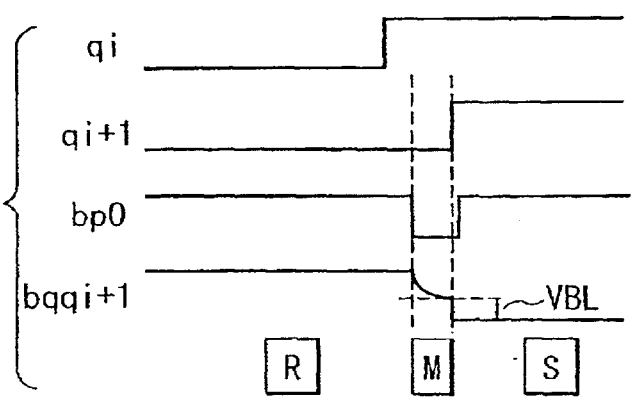

In contrast, as shown in FIG. 14B, when the output signals qi, qi+1 of a pair of adjacent state holding circuits go high and low respectively and the signal bp0 is generated, the intermediate state "M" appears.

When the pair of state holding circuits are in the intermediate state "M" where the holding circuits are in the set state and the reset state, the clocked signal CLK is delayed 1.5 times the amount of usual delay. As a result, the signal Dout outputted from the second delay line 16 is outputted (T−2(D1+D2))/2 later than the signal Din supplied to the first delay line 14 (as shown in FIG. 13). Furthermore, the signal Dout is delayed by the output buffer circuit 17 for the amount of delay D2. As a result, the internal clock signal ICK is delayed half the period from the external clock signal ECK.

With the second embodiment, in the intermediate state "M" where a pair of state holding circuits are in the set state and the reset state, the delay time of the unit delay element is made 1.5 times the amount of usual delay by decreasing the driving capability of the NMOS transistor constituting the clocked inverter circuit 16d−1 to which the clock signal CLK is supplied. As a result, the accuracy of synchronization can be improved to half the amount of delay in a unit delay element, which makes it possible to generate an internal clock signal ICK delayed half the period from the external clock signal ECK.

Figure 15:
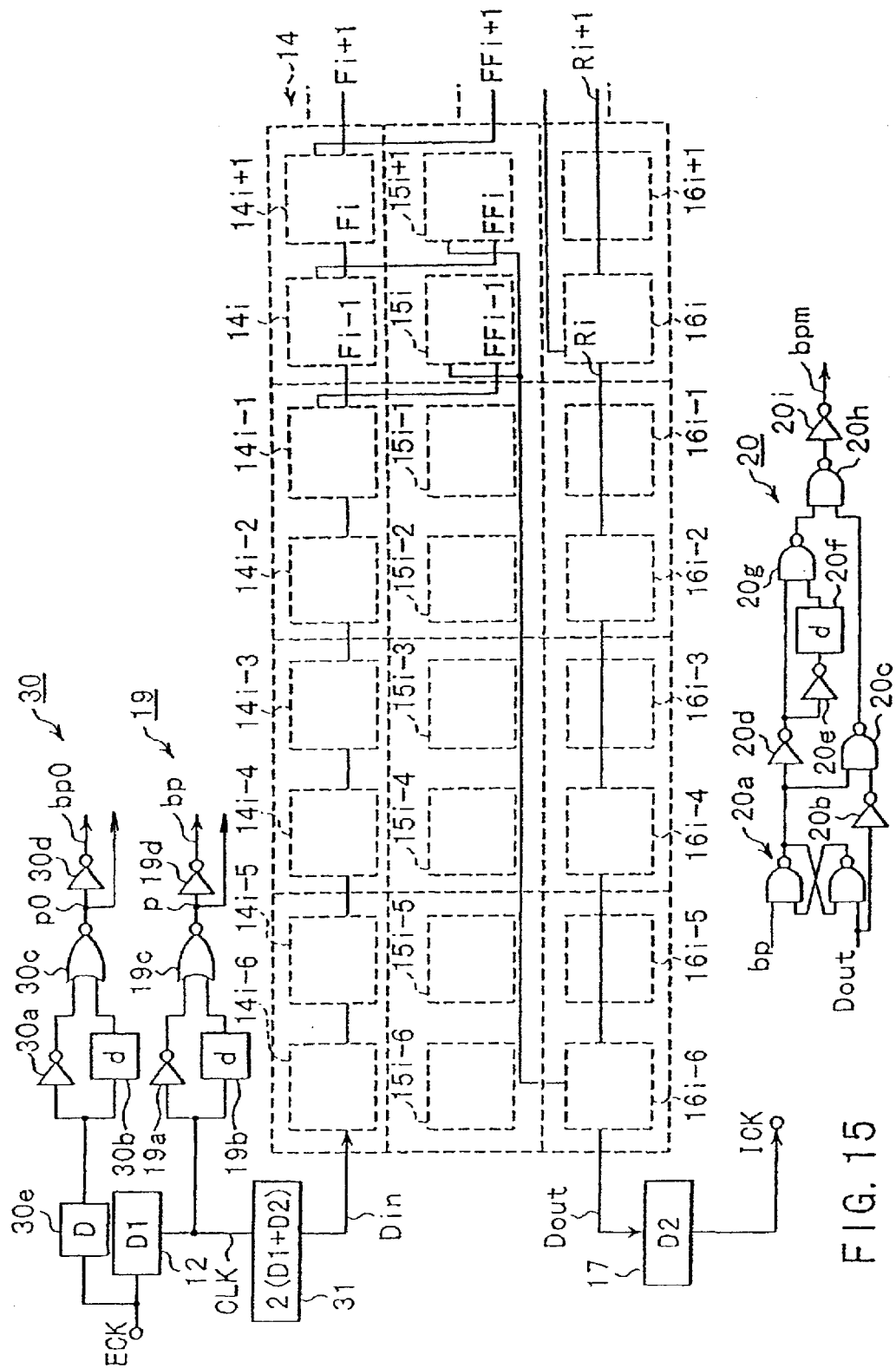
FIG. 15 shows the configuration of the synchronizing circuit to explain a modification of the second embodiment.
Figure 16:
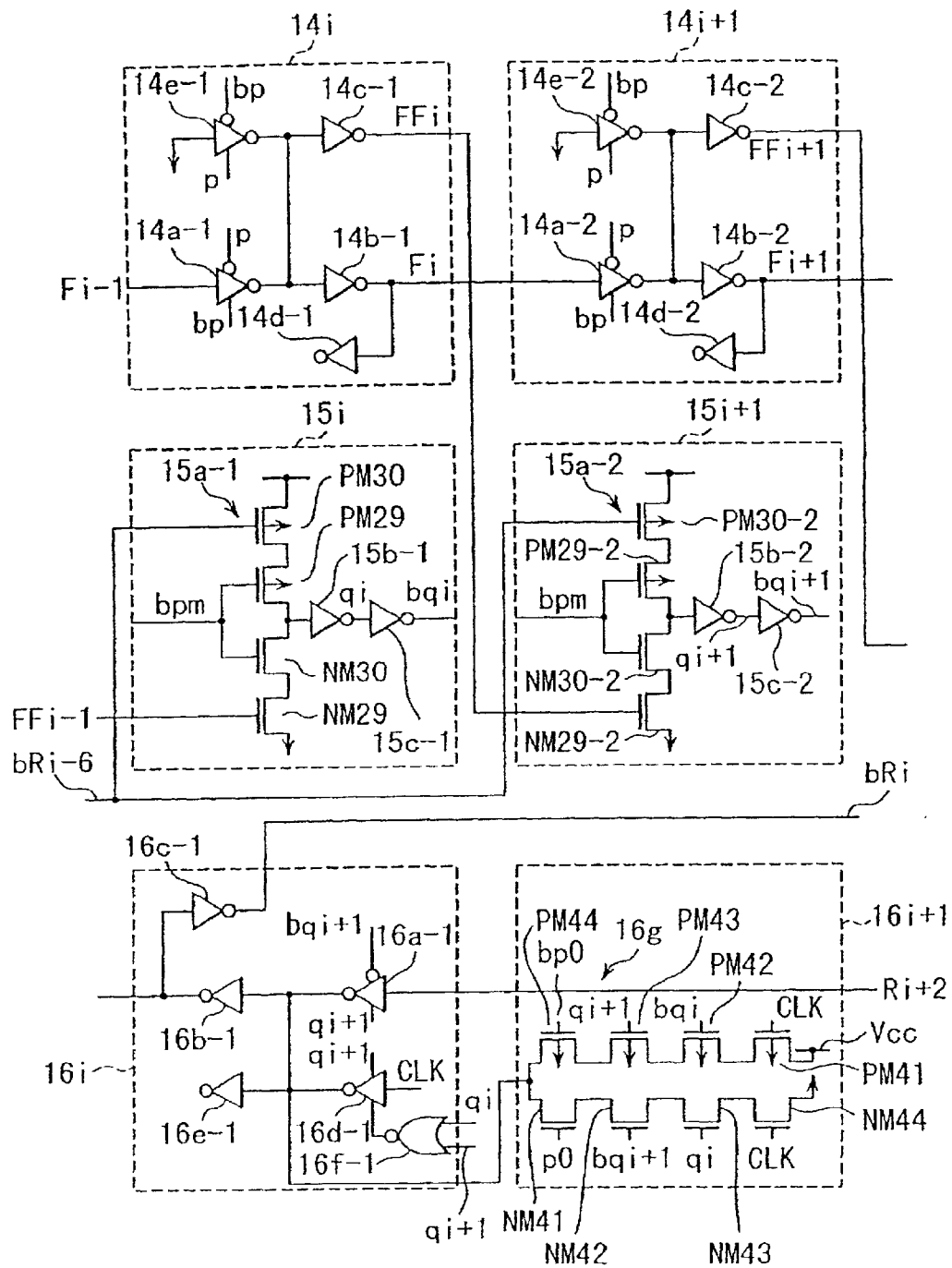
FIG. 16 is a circuit diagram of part of FIG. 15.
Figure 17:
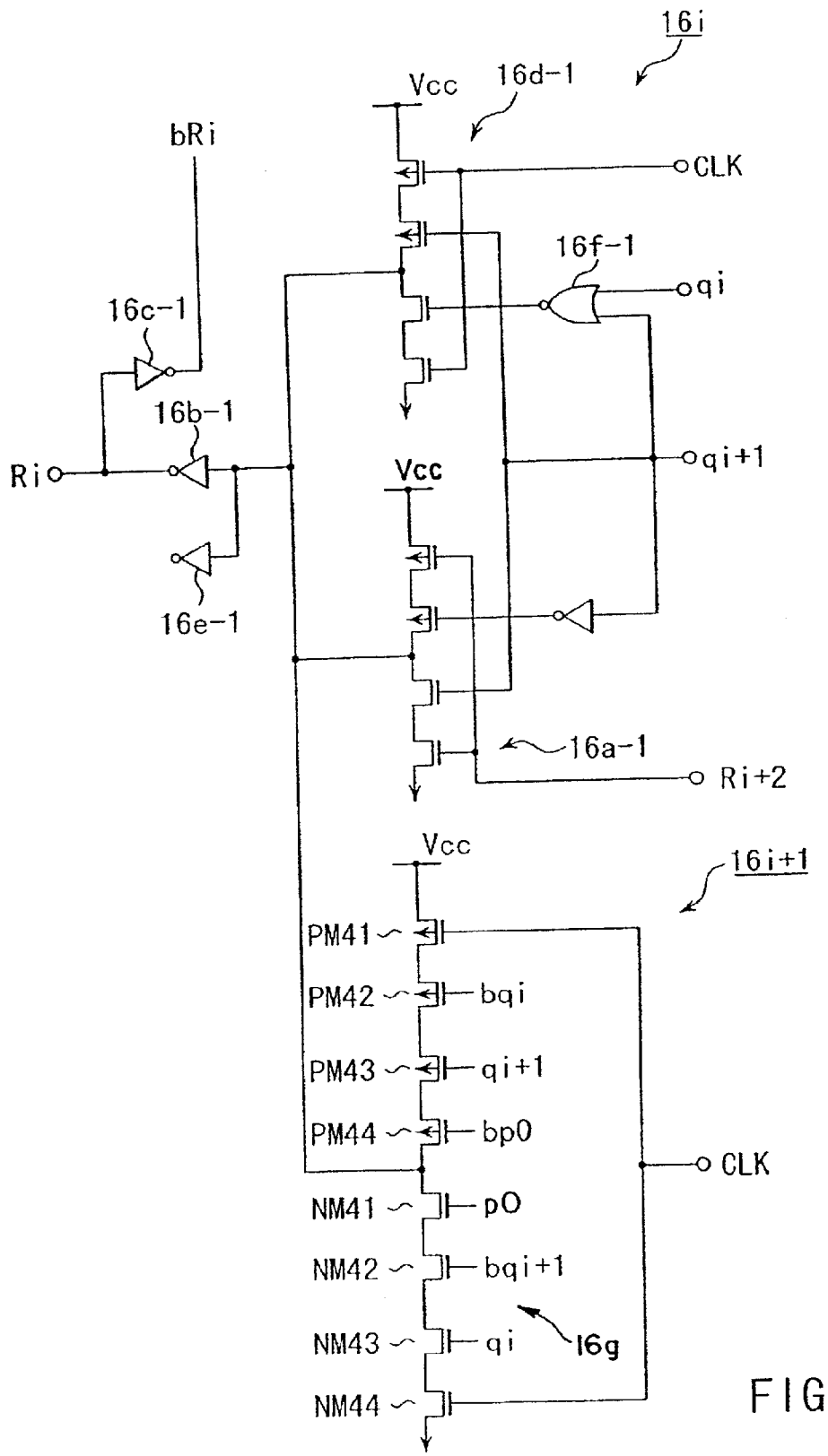
FIG. 17 is a circuit diagram of part of FIG. 16.

FIGS. 15 to 17 show a modification of the second embodiment. In FIGS. 15 to 17, the same parts as those in FIGS. 9 to 12 are indicated by the same reference symbols. The configuration of the state holding section 15 and the second delay line 16 in FIGS. 15 to 17 differs from that of FIGS. 9 to 12.

Specifically, in the state holding circuit 15i shown in FIG. 16, the inverter 15c−1 is connected in series with the output terminal of the inverter circuit 15b−1. The inverter circuit 15c−1 outputs a signal bqi at its output terminal. Similarly, in the state holding circuit 15i+1, the inverter 15c−2 is connected in series with the output terminal of the inverter circuit 15b−2. The inverter circuit 15c−2 outputs a signal bqi+1 at its output terminal.

As shown in FIGS. 16 and 17, in the unit delay element 16i constituting the second delay line, the clocked inverter circuit 16a−1 is controlled by the signals bqi+1, qi+1. In addition, the signals qi+1, qi are supplied to the input terminals of the NOR circuit 16f−1. The clocked inverter circuit 16d−1 is controlled by the signals qi+1 and the output signal of the NOR circuit 16f−1.

Furthermore, the signal generator circuit 16i+1 has a clocked inverter circuit 16g. The clocked inverter circuit 16g is composed of PMOS transistors PM41, PM42, PM43, PM44 and NMOS transistors NM41, NM42, MN43, NM44 connected in series between the power supply Vcc and the ground. The clock signal CLK is supplied to the gates of the PMOS transistor PM41 and NMOS transistor NM44. The signals bqi and qi are supplied to the gates of the PMOS transistor PM42 and NMOS transistor NM43, respectively. In addition, the signals qi+1 and bqi+1 are supplied to the gates of the PMOS transistor PM43 and NMOS transistor NM42, respectively. The signals bq0 and p0 are supplied to the gates of the PMOS transistor PM44 and NMOS transistor NM41, respectively. The connection node of the PMOS transistor PM44 and NMOS transistor NM41 is connected to the output terminals of the clocked inverter circuits 16a−1 and 16d−1.

When the output signals qi and qi+1 of a pair of adjacent state holding circuits 15i and 15i+1 are both at the high level, or when they are in the set state, the clocked inverter circuit 16a−1 of the unit delay element 16i is made conducting and the clocked inverter circuits 16d−1 and 16g are made nonconducting. This enables the backward pulse signal Ri+2 outputted from the unit delay element at the preceding stage to propagate through the clocked inverter circuit 16a−1 and inverter circuit 16b−1.

When the output signals qi and qi+1 of the pair of adjacent state holding circuits 15i and 15i+1 are both at the low level, or when they are in the reset state, the clocked inverter circuit 16d−1 of the unit delay element 16i is made conducting and the clocked inverter circuits 16a−1 and 16g are made nonconducting. As a result, the clock signal CLK is propagated via the clocked inverter circuit 16d−1 and inverter circuit 16b−1 to a subsequent stage.

When the output signal qi of the pair of adjacent state holding circuits 15i and 15i+1 is at the high level and the output signal qi+1 is at the low level, and the output signal bp0 of the first signal generator circuit 30 is at the low level, the pair are in the intermediate state. In the intermediate state, both of the clocked inverter circuits 16a−1 and 16d−1 are made nonconducting and the clocked inverter circuit 16g is made conducting. As a result, the clock signal CLK is propagated via the clocked inverter circuit 16g and inverter circuit 16b−1 to a subsequent stage. The amount of delay in the clock signal CLK passing through the clocked inverter circuit 16g is set 1.5 times as large as the amount of delay required to pass through the clocked inverter circuit 16a−1 or the amount of delay required to pass through the clocked inverter circuit 16d−1. With the setting means, at least one of, for example, the channel width and channel length of the NMOS transistor and PMOS transistor constituting the clocked inverter circuit 16g, the threshold voltages of these transistors, and the voltage of the substrate at which the transistors are formed is changed. In this way, the current driving capability of the NMOS transistor is lowered.

For example, when the channel width is changed, the channel width of the NMOS transistor is made narrower than the ordinary size. When the channel length is changed, the channel length of the NMOS transistor is made greater than the channel length of the PMOS transistor. When the threshold voltage of the transistor is changed, the threshold voltage of the NMOS transistor is made higher than usual and the threshold voltage of the PMOS transistor is made lower than usual. When the substrate voltage is changed, the backgating bias of the NMOS transistor is made higher than the backgating bias of the PMOS transistor.

When the amount of delay in the clocked inverter circuit 16g itself is equal to or more than 1.5 times that in a unit delay element, the signal one stage of inverter circuit before the clock signal CLK supplied to the clocked inverter circuit 16d−1 is used as the clock signal CLK supplied to the clocked inverter circuit 16g. Depending on the situation, the signal two stages of inverter circuit before the clock signal CLK may be used instead. Specifically, the clock signal with earlier timing than that of the clock signal CLK supplied to the clocked inverter circuit 16d−1 may be used.

Furthermore, the sizes, threshold voltages, and substrate voltages of the PMOS transistors and NMOS transistors constituting the clocked inverter circuit 16g may be combined with the location at which the inverted clock signal bCLK is drawn out.

With the above configuration, in the intermediate state "M" where a pair of state holding circuits are in the set state and in the reset state, the clocked inverter circuit 16g transfers the clock signal CLK. By lowering the driving capability of the NMOS transistors constituting the clocked inverter circuit 16g, the delay time of the unit delay element is made 1.5 times the amount of usual delay. As a result, the accuracy of synchronization can be improved to half the amount of delay in the unit delay element, which makes it possible to generate an internal clock signal ICK delayed half the period from the external clock signal ECK.

While in the second embodiment, the case where the amount of delay in the second delay line is made 1.5 times the amount of usual delay, it goes without saying that the amount of delay in the second delay line may be set to a value other than 1.5 times.

Third Embodiment

In the second embodiment, the accuracy of synchronization can be improved to half the amount of delay in a unit delay element. The internal clock signal synchronized with the external clock signal is shifted half the period from the external clock signal. In a third embodiment of the present invention, a circuit which has half the amount of delay in a unit delay element (that is, half the accuracy of synchronization) and whose clock signal has the same phase and period as those of an external clock signal will be explained.

Figure 18:
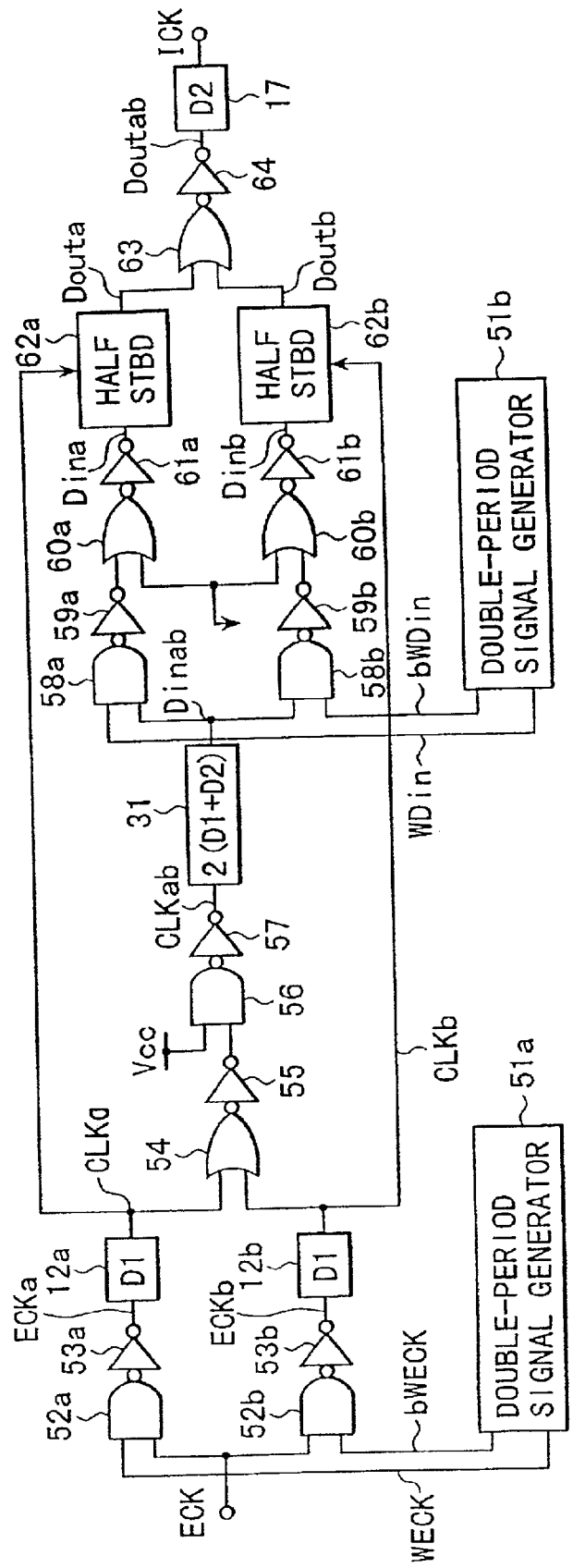
FIG. 18 shows the configuration of a third embodiment of the present invention.
Figure 19:
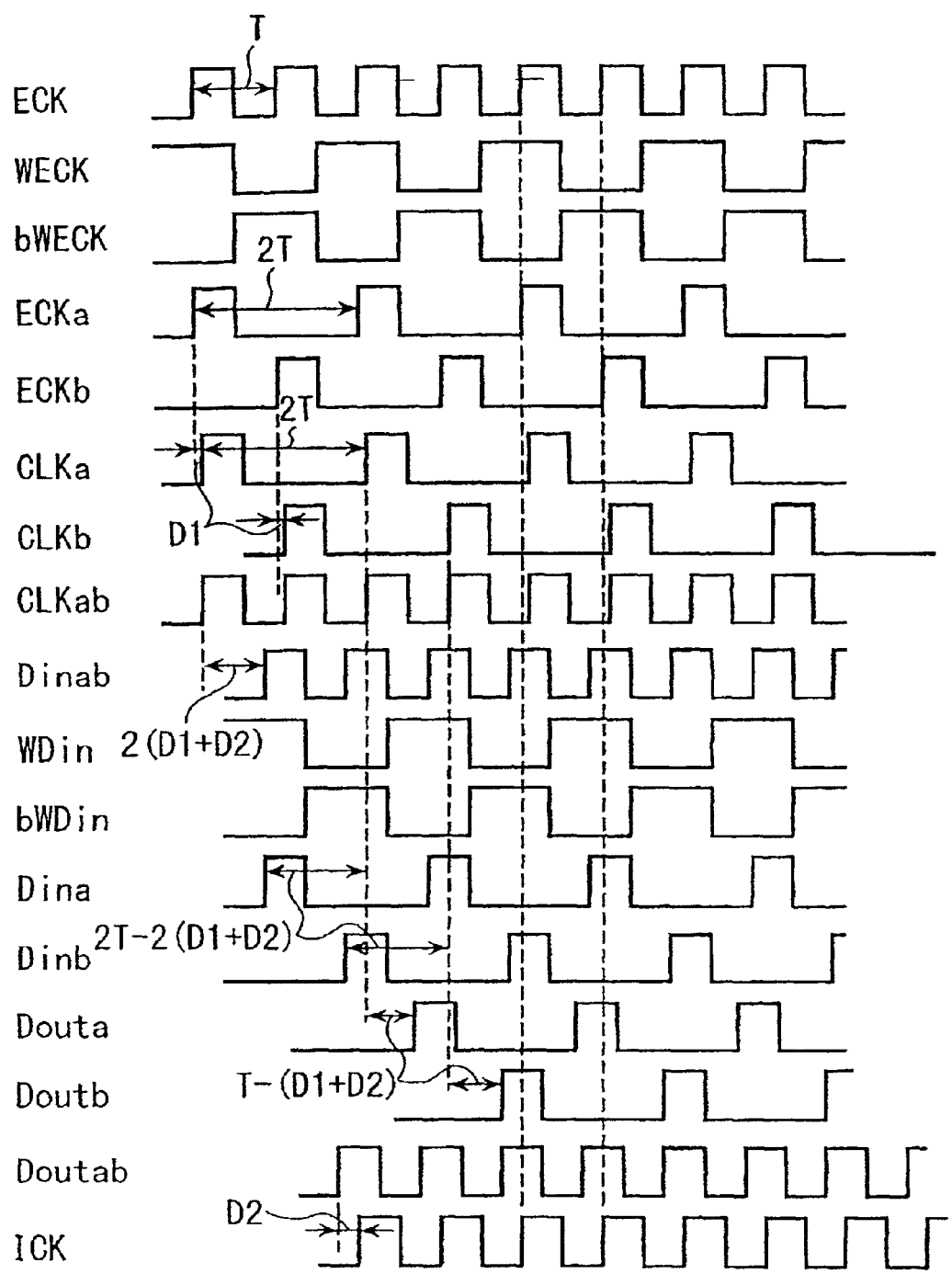
FIG. 19 is a waveform diagram to explain the operation of FIG. 18.

FIG. 18 shows the third embodiment of the present invention. In FIG. 18, the same parts as those in FIG. 15 are indicated by the same reference symbols. FIG. 19 shows the signals at various sections of FIG. 18. In FIG. 18, a double period signal generator circuit 51a generates signals WECK and bWECK which have twice the period of an external clock signal ECK. The signal WECK, together with the external clock signal ECK, is supplied to a NAND 52a. The signal bWECK, together with the external clock signal ECK, is supplied to a NAND 52b. The output signals of the NAND circuits 52a and 52b are supplied to inverter circuits 53a and 53b respectively. The output signals ECKa and ECKb of the inverter circuits 53a and 53b are clock signals separated into odd and even clock signals according to the signals WECK and bWECK. The signals ECKa and ECKb are supplied to input buffer circuits 12a and 12b with the amount of delay D1, respectively.

The odd and even clock signals CLKa and CLKb outputted from the input buffer circuits 12a and 12b are combined via a NOR circuit 54 and an inverter circuit 55. The resulting signal is supplied to one input terminal of a NAND circuit 56. A power supply voltage Vcc is supplied to the other input terminal of the NAND circuit 56. The output signal of the NAND circuit 56 is supplied to an inverter circuit 57. The output signal CLKab of the inverter circuit 57 is supplied to a delay monitor 31.

On the other hand, the double-period signal generator circuit 51b generates signals WDin and bWDin with twice the period of the external clock signal ECK as shown in FIG. 19. The signal WDin, together with the signal Dinab with a delay time of 2(D1+D2) outputted from the delay monitor 31, is supplied to a NAND circuit 58a. The signal bWDin, together with the output signal Dinab of the delay monitor 31, is supplied to a NAND circuit 58b. The output signals from the NAND circuits 58a and 58b are supplied via inverter circuits 59a and 59b to one input terminal of each of NOR circuits 60a and 60b, respectively. The other input terminals of the NOR circuits 60a and 60b are grounded. The output terminals of the NOR circuits 60a and 60b are connected to inverter circuits 61a and 61b respectively. The output signals Dina and Dinb of the inverter circuits 61a and 61b are obtained by separating the output signal Dinab of the delay monitor 31 into odd and even signals according to the signal WDin and bWDin. The signals Dina and Dinb, together with the odd and even clock signals CLKa and CLKb outputted from the input buffer circuits 12a and 12b, are supplied to half STBD (Synchronous Traced Backward Delay) 62a and 62b. The half STBD 62a, and half STBD 62b have the same configuration as that of the circuit shown in FIG. 15. Specifically, the second delay line for backward pulses is made half the length of the first delay line for forward pulses. The state holding section has three states: a set state, a reset state, and an intermediate state. The odd and even signals Douta and Doutb outputted from the half STBD 62a, and half 62b are combined via a NOR circuit 63 and an inverter circuit 64. The resultant output signal Doutab outputted from the inverter circuit 64 is supplied to an output buffer circuit 17 with a delay time of D2. The output buffer circuit 17 outputs an internal clock signal ICK. The internal clock signal ICK synchronizes with the external clock signal ECK and has the period coinciding with the external clock signal ECK.

With the third embodiment, the external clock signal is divided into an odd clock signal and an even clock signal. The odd and even clock signals are shifted half the period from the external clock signal and each synchronized with the external clock independently. Then, the odd and even signal shifted half the period from and synchronized with the external clock signal are combined. As a result, the accuracy of synchronization can be improved to half the amount of delay in the unit delay element. In addition, an internal clock signal ICK synchronizing with the external clock signal can be generated.

Furthermore, when the external clock signal is divided into an odd clock signal and an even clock signal and the odd and even clock signals are shifted half the period from the external clock signal and each synchronized with the external clock signal independently, a series connection of the odd clock circuit and the even clock circuit can be considered. In this case, there is a possibility that phase shift will be amplified. By connecting the odd clock circuit and the even clock circuit in parallel as shown in the third embodiment, the amplification of the phase shift can be prevented.

Fourth Embodiment

Hereinafter, a fourth embodiment of the present invention will be explained. In the second and third embodiments, the state holding section has three states: the set state, reset state, and intermediate state. This enables the internal clock signal to be shifted half the period from and synchronized with the external clock signal. In the fourth embodiment, a circuit which shifts the internal clock signal one-fourth the period from the external clock signal and synchronizes the resulting signal with the external clock signal will be explained.

FIGS. 20A to 20E show a state holding section according to the fourth embodiment of the present invention. In the fourth embodiment four adjacent state holding circuits make one set, which enables the setting of five states. Specifically, as shown by 15$i$ in FIG. 20A, when all the four state holding circuits are reset, they are defined as being in the reset state "R". As shown by 15$i$ in FIG. 20E, when all the four state holding circuits are set, they are defined as being in the set state "S". As shown by 15$i$ in FIG. 20B, when, of the four state holding circuits, one is set and the remaining three are reset, they are defined as being in a first intermediate state "M1". As shown by 15$i$ in FIG. 20C, when, of the four state holding circuits, two are set and the remaining two are reset, they are defined as being in a second intermediate state "M2". As shown by 15$i$ in FIG. 20D, when, of the four state holding circuits, three are set and the remaining one is reset, they are defined as being in a third intermediate state "M3".

FIGS. 21 to 25 show part of the first delay line 14, state holding section 15, and second delay line 16 related to the fourth embodiment. In FIGS. 21 to 25, the same parts as those in the first to third embodiments are indicated by the same reference symbols.

As shown in FIG. 21, four state holding circuits make a set in the state holding section 15. In the second delay line 16, one unit delay element 16$i$+1 is allocated to four state holding circuits 15$i$+1 to 15$i$+4.

Figure 22:
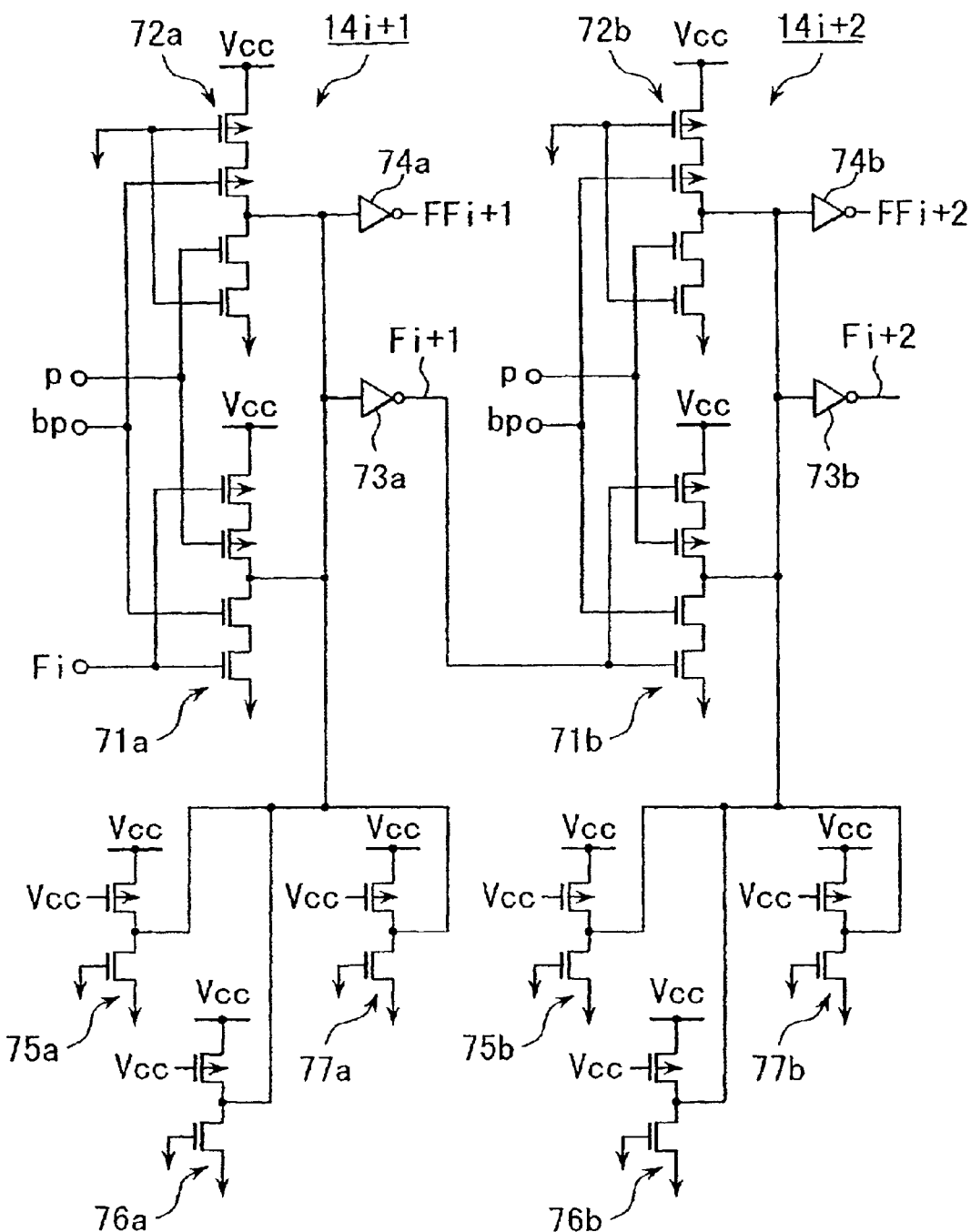
FIG. 22 is a circuit diagram of part of FIG. 21.
Figure 23:
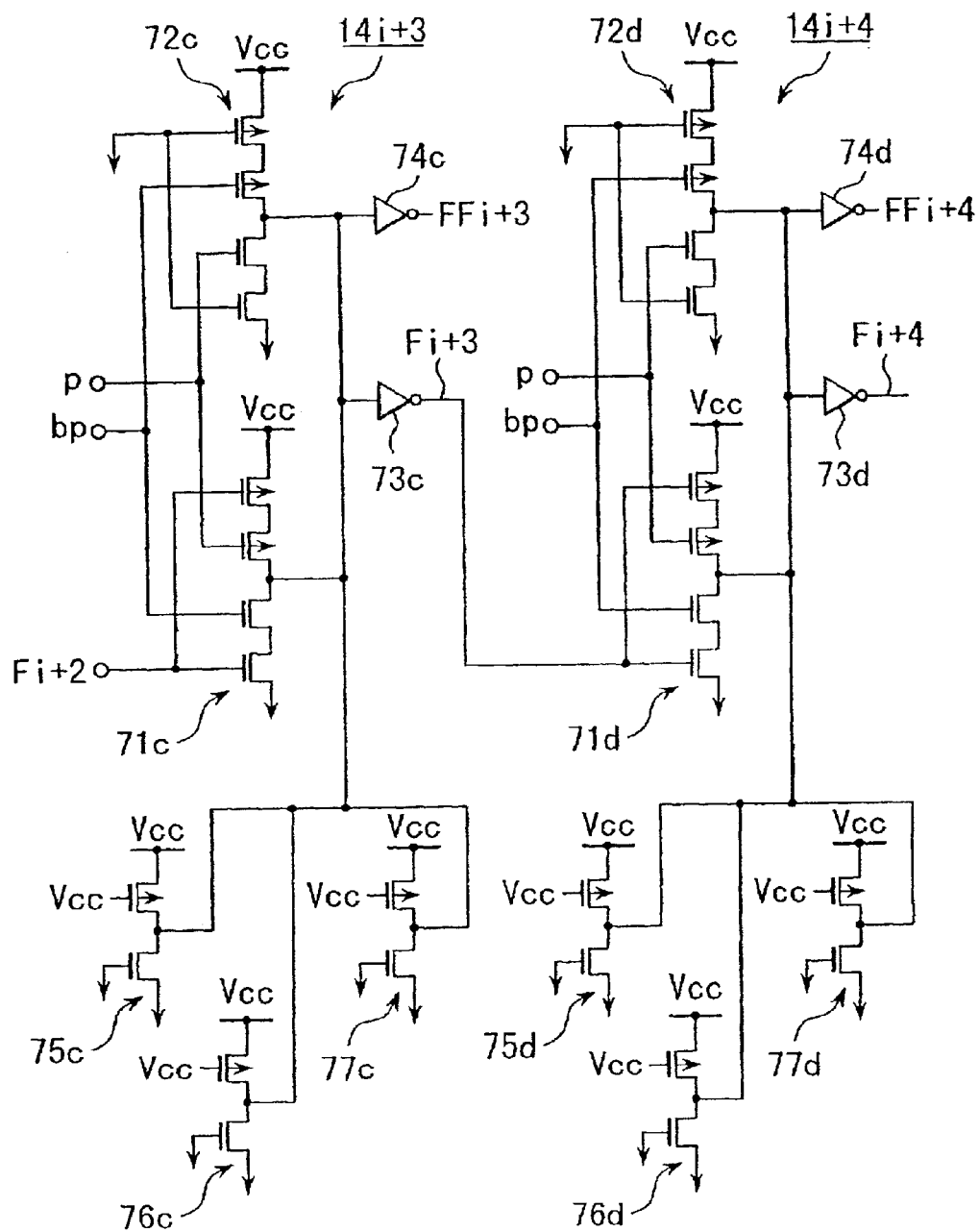
FIG. 23 is a circuit diagram of part of FIG. 21.

FIG. 22 shows unit delay elements 14$i$+1 and 14$i$+2 constituting the first delay line 14 FIG. 23 shows unit delay elements 14$i$+3 and 14$i$+4 constituting the first delay line 14.

The unit delay elements 14i+1 to 14i+4 have the same configuration. The output signal of a unit delay element at the preceding stage is inputted to a unit delay element and a state holding circuit at a subsequent stage.

The unit delay element 14i+1 is composed of inverter circuits 71a, 72a, 73a, 74a, 75a, 76a, and 77a. The output signal Fi of the unit delay element 14i at the preceding stage is supplied to the inverter circuit 71a. The inverter circuit 72a has its input terminal grounded and its output terminal connected to the output terminal of the inverter circuit 71a. The inverter circuit 73a has its input terminal connected to the output terminals of the inverter circuits 71a and 72a and outputs a signal Fi+1 at its output terminal. The inverter circuit 74a has its input terminal connected to the output terminals of the inverter circuits 71a and 72a and outputs a signal FFi+1 at its output terminal. The inverter circuits 75a, 76a, and 77a are dummy inverter circuits corresponding to the signal generator circuit connected to the unit delay element constituting the second delay line, which will be explained later.

In the unit delay elements 14i+2 to 14i+4, the same parts as those of the unit delay element 14i+1 are suffixed with "b," "c," and "d," and explanation of them will be omitted.

Figure 24:
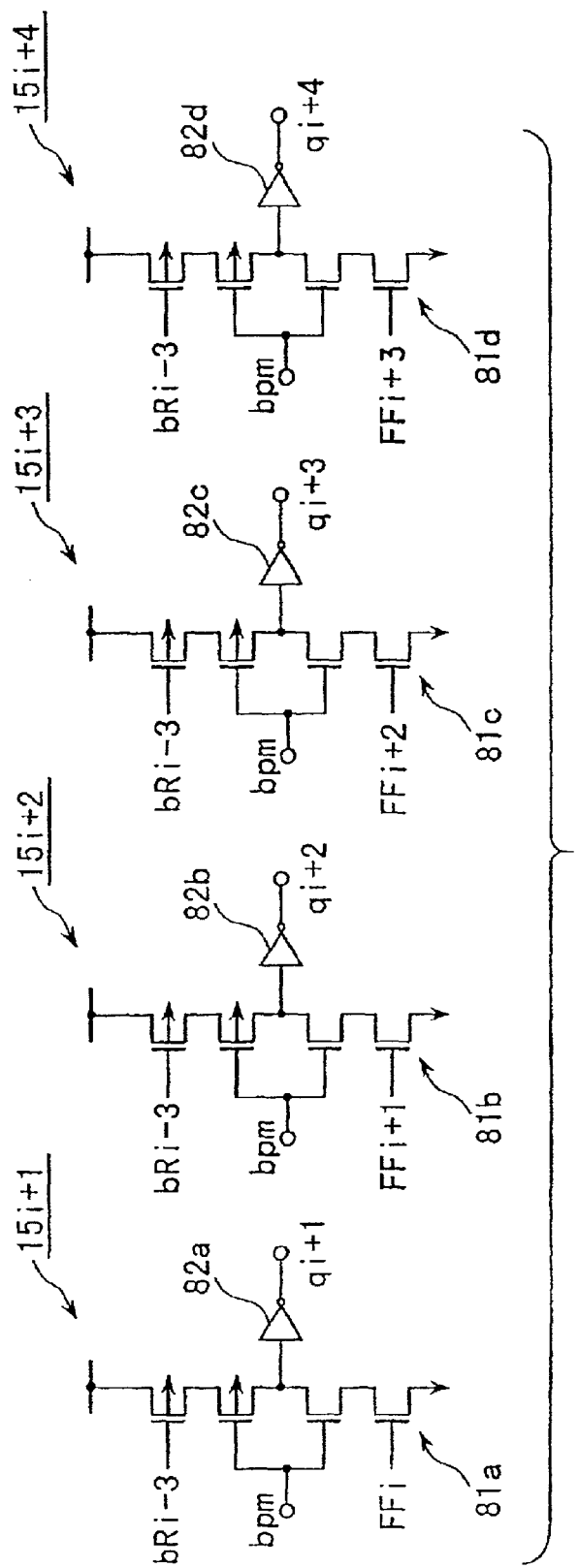
FIG. 24 is a circuit diagram of part of FIG. 21.

FIG. 24 shows the configuration of the state holding circuits 15i+1 to 15i+4. The state holding circuits 15i+1 to 15i+4 have the same configuration. Each of the state holding circuits 15i+1 to 15i+4 is composed of clocked inverter circuits 81a, 81b, 81c, and 81d controlled according to a signal bpm and inverter circuits 82a, 82b, 82c, and 82d connected to the output terminals of the clocked inverter circuits 81a to 81d, respectively. Each of the state holding circuits 15i+1 to 15i+4 is set according to the output signals FFi to FFi+3 of the unit delay elements 14i to 14i+3 constituting the first delay line 14 and reset according to the output signal of the unit delay element 16i–3 (not shown) constituting the second delay line 16. The state holding circuits 15i+1 to 15i+4 output signals qi+1 to qi+4, respectively.

Figure 25:
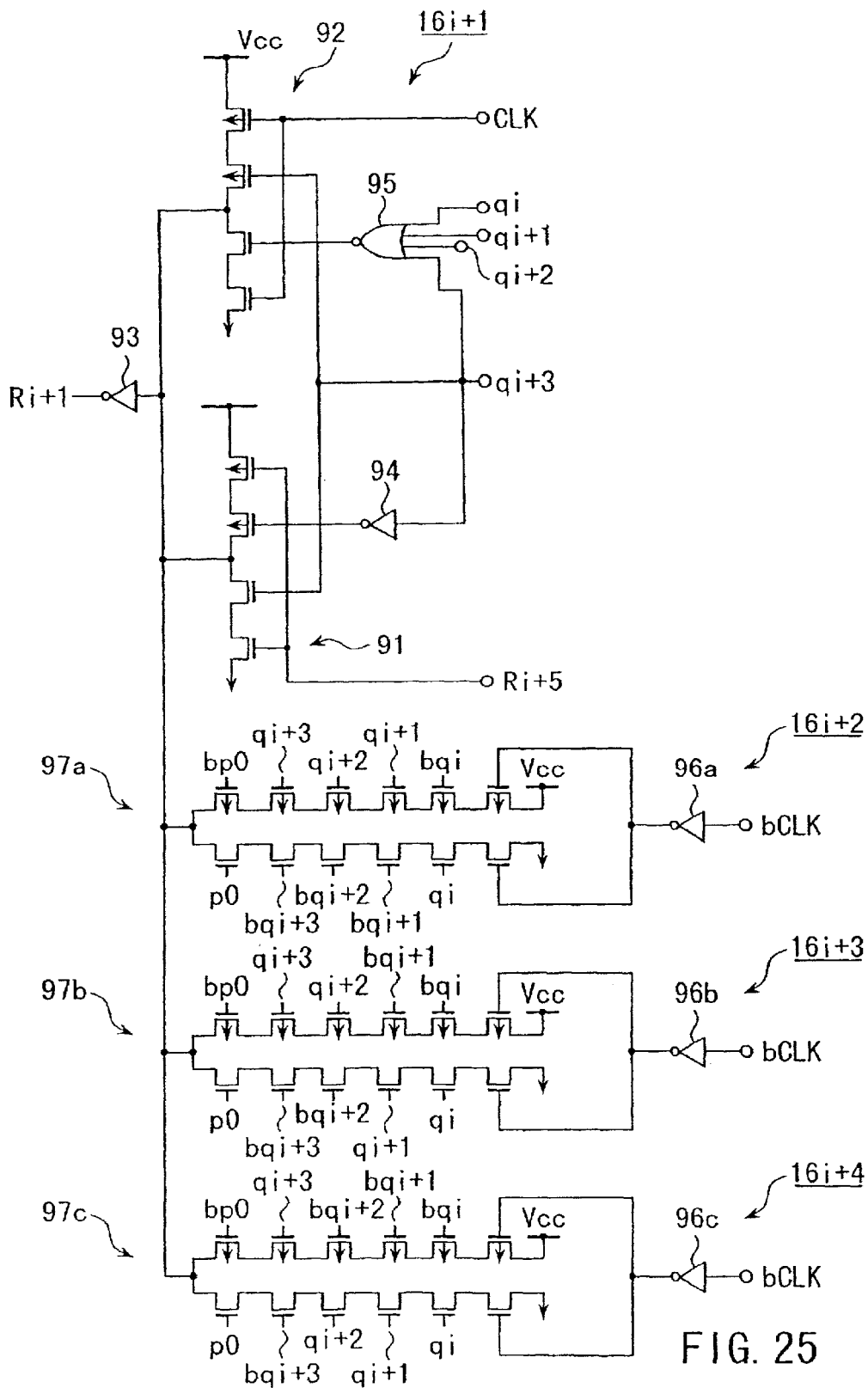
FIG. 25 is a circuit diagram of part of FIG. 21.

FIG. 25 shows a unit delay element 16i+1 constituting the second delay line 16. The unit delay element 16i+1 is composed of clocked inverter circuits 91 and 92, inverter circuits 93 and 94 and a NOR circuit 95. The signal Ri+5 outputted from the unit delay element 16i+5 (not shown) at the preceding stage is inputted to the input terminal of the clocked inverter circuit 91. The clock signal CLK is supplied to the input terminal of the clocked inverter circuit 92. The inverter circuit 93 has its input terminal connected to the output terminals of the clocked inverter circuits 91 and 92 and outputs a signal Ri+1 at its output terminal. The inverter circuit 94 receives a signal qi+3 and has its output terminal connected to the clocked inverter circuit 91. The NOR circuit 95 receives signals qi, qi+1 and qi+2 and has its output terminal connected to the clocked inverter circuit 92.

The clocked inverter circuit 91 is controlled by the output signal qi+3 of the state holding circuit 15i+3 and the signal bqi+3 inverted by the inverter circuit 94. The output signals qi, qi+1 and qi+2 of the state holding circuits 15i, 15i+1 and 15i+2 are supplied to the NOR circuit 95. The clocked inverter circuit 92 is controlled by the output signal of the NOR circuit 95 and the output signal qi+3 of the state holding circuit 15i+3.

Signal generator circuits 16i+2, 16i+3 and 16i+4 are connected to the input terminal of the inverter circuit 93. Each of the signal generator circuits 16i+2, 16i+3 and 16i+4 is composed of inverter circuits 96a, 96b and 96c to which a clock signal bCLK with earlier timing than the clock signal CLK is supplied and clocked inverter circuits 97a, 97b and 97c to which the clock signals CLK outputted from the inverter circuits 96a, 96b and 96c are supplied.

In the clocked inverter circuit 97a, the PMOS transistors are controlled by signals CLK, bqi, qi+1, qi+2, qi+3 and bp0 and the NMOS transistors are controlled by signals CLK, qi, bqi+1, bqi+2, bqi+3 and p0.

In the clocked inverter circuit 97b, the PMOS transistors are controlled by signals CLK, bqi, bqi+1, qi+2, qi+3 and bp0 and the NMOS transistors are controlled by signals CLK, qi, qi+1, bqi+2, bqi+3 and p0.

In the clocked inverter circuit 97c, the PMOS transistors are controlled by signals CLK, bqi, bqi+1, bqi+2, qi+3 and bp0 and the NMOS transistors are controlled by signals CLK, qi, qi+1, qi+2, bqi+3 and p0.

In the above configuration, when the state holding section is in the set state, all the output signals qi, qi+1, qi+2 and qi+3 of the four adjacent state holding circuits 15i, 15i+1, 15i+2 and 15i+3 are at the high level. At this time, in the unit delay element 16i+1 of the second delay line 16, the clocked inverter circuit 91 is made conducting and the clocked inverter circuits 92, 96a, 96b and 96c are made nonconducting. This allows the output signal Ri+5 of the unit delay element at the preceding stage to pass through.

On the other hand, when the state holding section is in the reset state, all the output signals qi, qi+1, qi+2 and qi+3 of the four adjacent state holding circuits 15i, 15i+1, 15i+2 and 15i+3 are at the low level. At this time, in the unit delay element 16i+1, the clocked inverter circuits 91, 96a, 96b and 96c are made nonconducting and the clocked inverter circuit 92 is made conducting. This allows the clock signal CLK to pass through.

When the state holding section is in the first intermediate state "M1," the signal qi is high and the signals qi+1, qi+2 and qi+3 are low. At this time, the clocked inverter circuit 97a is conducting, forming such a path as has 1.25 times the amount of delay in a unit delay element from the rising of the clock signal CLK.

When the state holding section is in the second intermediate state "M2," the signals qi and qi+1 are high and the signals qi+2 and qi+3 are low. At this time, the clocked inverter circuit 97b is conducting, forming such a path as has 1.5 times the amount of delay in a unit delay element from the rising of the clock signal CLK.

When the state holding section is in the third intermediate state "M3," the signals qi, qi+1 and qi+2 are high and the signal qi+3 is low. At this time, the clocked inverter circuit 97c is conducting, forming such a path as has 1.75 times the amount of delay in a unit delay element from the rising of the clock signal CLK.

Specifically, the amount of delay in the clocked inverter circuits 97a, 97b and 97c is set to 1+m/4 (m=1, 2, 3) times the amount of delay in the clocked inverter circuits 91 and 92.

As described above, 1.25 times, 1.5 times, and 1.75 times the amount of delay in a unit delay element can be realized by changing the channel width of the NMOS transistors and PMOS transistors constituting the clocked inverter circuits to decrease the current driving capability. Alternately, they can be realized by using the signal bbCLK one stage of inverter circuit before the signal bCLK as the input signal to the signal generator circuits 16i+2, 16i+3 and 16i+4.

With the fourth embodiment, since the internal clock signal can be synchronized with the external clock signal with an accuracy of one-fourth the amount of delay in a unit delay element, the accuracy of synchronization can be improved much more.

Fifth Embodiment

With the forth embodiment, the accuracy of synchronization can be improved to one-fourth the amount of delay in a unit delay element. The synchronized internal clock signal, however, is shifted one-fourth of the period from the external clock signal. In a fifth embodiment of the present invention, a circuit for generating an internal clock signal synchronizing with the external clock by combining four units of the synchronizing circuit of the fourth embodiment in parallel will be explained.

Figure 26:
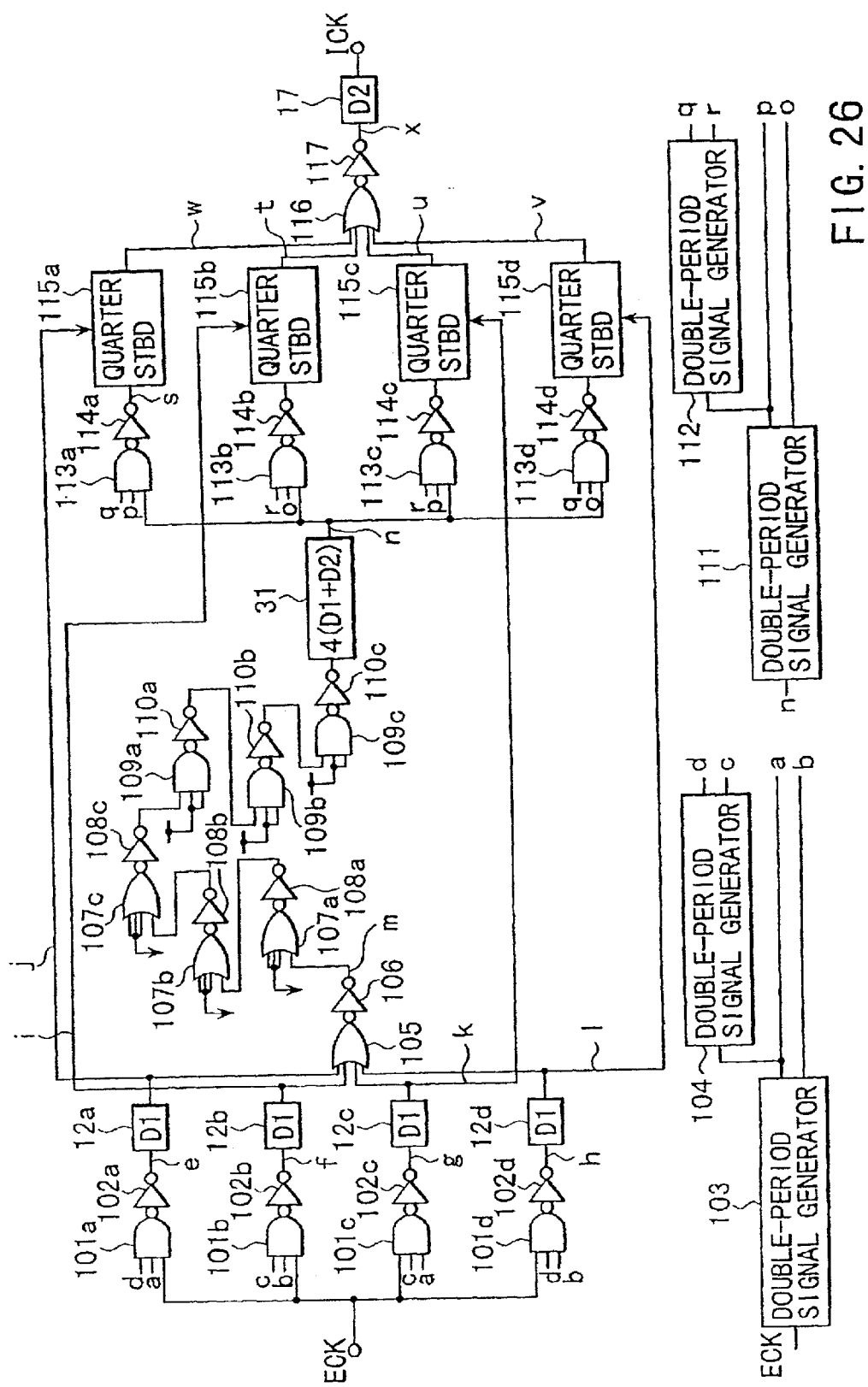
FIG. 26 shows the configuration of a synchronizing circuit according to a fifth embodiment of the present invention.
Figure 27:
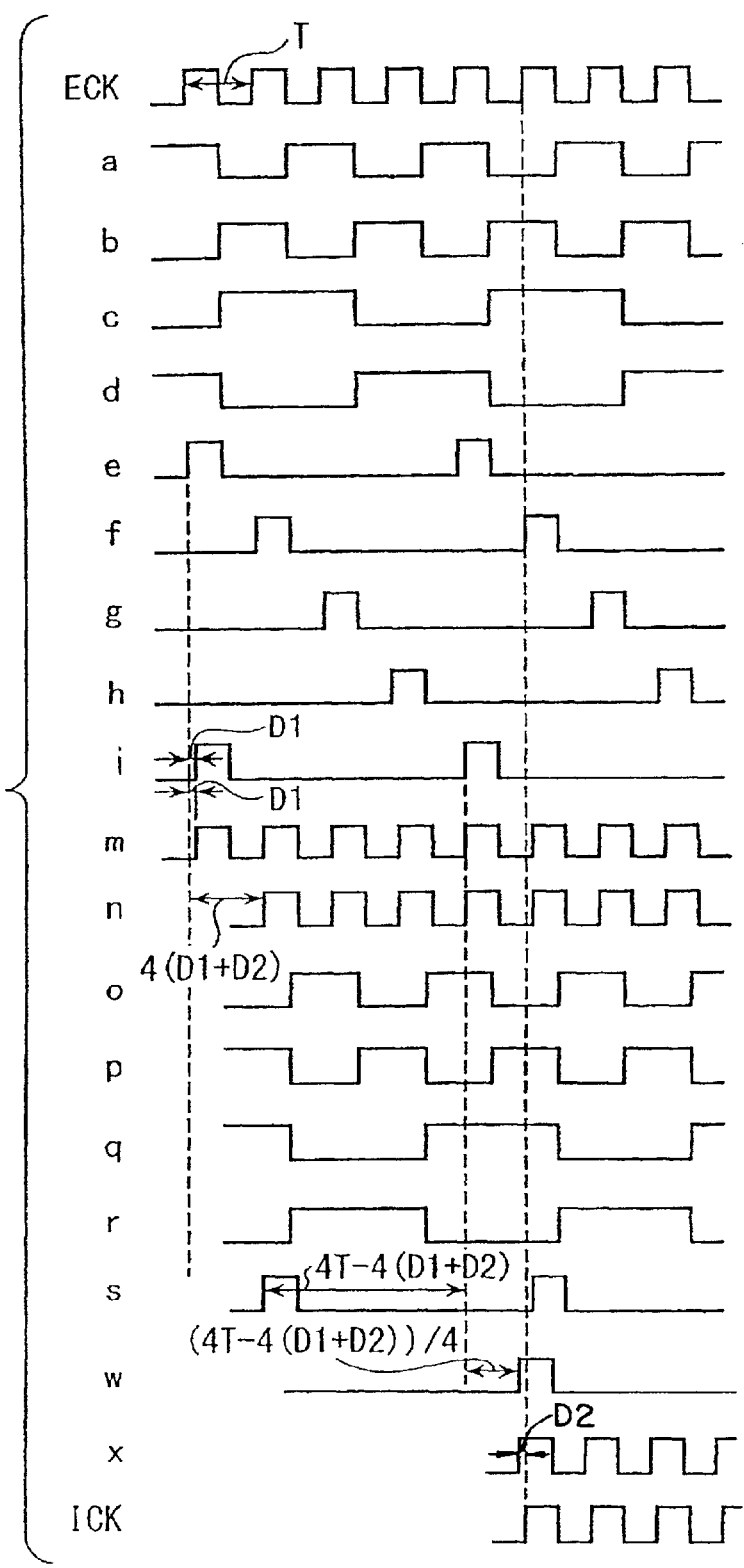
FIG. 27 is a waveform diagram to explain the operation of FIG. 26.

FIG. 26 shows a synchronizing circuit according to the fifth embodiment and FIG. 27 shows the signals at various sections in FIG. 26. The synchronizing circuit is basically the same as the circuit shown in FIG. 18. The external clock signal ECK is divided into four clock signals. Each clock signal is shifted one-fourth of the period independently. The resulting clock signals shifted one-fourth of the period from each other are combined by a NOR circuit, which thereby generates an internal clock signal ICK.

Specifically, the external clock signal ECK is supplied to four NAND circuits 101a to 101d. The signals (a, b, c, d) supplied from double-period signal generator circuits 103 and 104 are supplied to the NAND circuits 101a to 101d. The output signals of the NAND circuits 101a to 101d are supplied to inverter circuits 102a to 102d. The output signals (e, f, g, h) of the inverter circuits 102a to 102d are supplied to input buffer circuits 12a to 12d. The output signals (i, j, k, l where j, k, l are not shown in FIG. 27) of the input buffer circuits 12a to 12d are supplied to a NOR circuit 105 and then to an inverter circuit 106, with the result that they are combined. The output signal (m) of the inverter circuit 106 passes through NOR circuits 107a to 107c, inverter circuits 108a to 108c, NAND circuits 109a to 109c, and inverter circuits 110a to 110c and is supplied to a delay monitor 31.

The output signal (n) of the delay monitor 31 is supplied to NAND circuits 113a to 113d. The signals (o, p, q, r) supplied from the double-period signal generator circuits 111 and 112 are supplied to the NAND circuits 113a to 113d. The output signals of the NAND circuits 113a to 113d are supplied via inverter circuits 114a to 114d to quarters STBD 115a to STBD 115d. The output signal (s) of the inverter circuit 114a is as shown in FIG. 27. The output signals of the other inverter circuits 114b to 114d are delayed for half the clock of the signal (n) from the signal (s) in sequence. The signals supplied from the input buffer circuits 12a to 12d are supplied to the quarters STBD 115a to STBD 115d, respectively. As shown in FIGS. 21 to 25, in the quarters STBD 115a to STBD 115d, the second delay line for backward pulses is made one-fourth the first delay line for forward pulses. The state holding section has five states: the set state, the reset state, and a first to a third intermediate state. The output signals (w, t, u, v, where t, u, v are not shown in FIG. 27) of the quarters STBD 115a to STBD 115d are supplied to a NOR circuit 116 and then to an inverter circuit 117, with result that they are combined. The output signal (x) of the inverter circuit 117 is supplied to an output buffer circuit 17 with delay time of D2. The output buffer circuit 17 outputs an internal clock signal ICK at its output terminal. The internal clock signal ICK has the same period as that of the external clock signal ECK and is in synchronization with the external clock signal ECK.

With the fifth embodiment, because the internal clock signal is synchronized with the external clock signal with an accuracy of one-fourth the amount of delay in a unit delay element, the accuracy of synchronization is improved. Moreover, an internal clock signal ICK with the same period of the external clock ECK can be generated.

In the fourth and fifth embodiments, the circuits for improving the accuracy of synchronization and synchronizing the internal clock signal with the external clock signal have been explained. The essence of the fourth and fifth embodiments is that the high-frequency clock signal is divided into low-frequency clock signals and each of the low-frequency clock signals is synchronized with the high-frequency clock signal. Finally, the low-frequency clock signals are combined by an OR circuit (or a NOR circuit) to restore the high-frequency clock signal.

In the first to third embodiments, use of a single synchronizing circuit limits the frequency band. Since the input buffer circuits and output buffer circuits have delay particularly in a high-frequency band, the single synchronizing circuit can deal with a maximum of about 300 MHz. However, use of the circuits shown in the fourth and fifth embodiments theoretically removes a limit on the frequency.

Sixth Embodiment

Hereinafter, means for making constant the pulse width of the signal supplied to the unit delay elements constituting a delay line and the pulse width of the signal outputted from the unit delay elements will be explained.

Generally, when the size of an NMOS transistor is equal to that of a PMOS transistor, the NMOS transistor has a higher current driving capability than that of the PMOS transistor. When the ratio of the current driving capability of the NMOS transistor to that of the PMOS transistor in a CMOS inverter circuit is 2:1 and the NMOS and PMOS transistors have the same channel length, the ratio of the channel width of the NMOS transistor to that of the PMOS transistor is generally set to 1:2 to equalize the logical threshold values, thereby causing the rising time of the pulse signal to coincide with its falling time.

In the case of a NOR circuit where the ratio of the current driving capability of the NMOS transistor to that of the PMOS transistor is 2:1, when the logical threshold values are equalized, the ratio of the channel width of the NMOS transistor to that of the PMOS transistor is 1:4. Similarly, in the case of a NAND circuit, the channel width ratio is 1:1.

For example, a unit delay element includes a NOR circuit whose logical threshold values are equalized. Although the pulse widths of the two input signals to the NOR circuit are the same, the pulse width will change because of the logic of the NOR circuit, when one pulse is later in timing than the other pulse.

Figure 28:
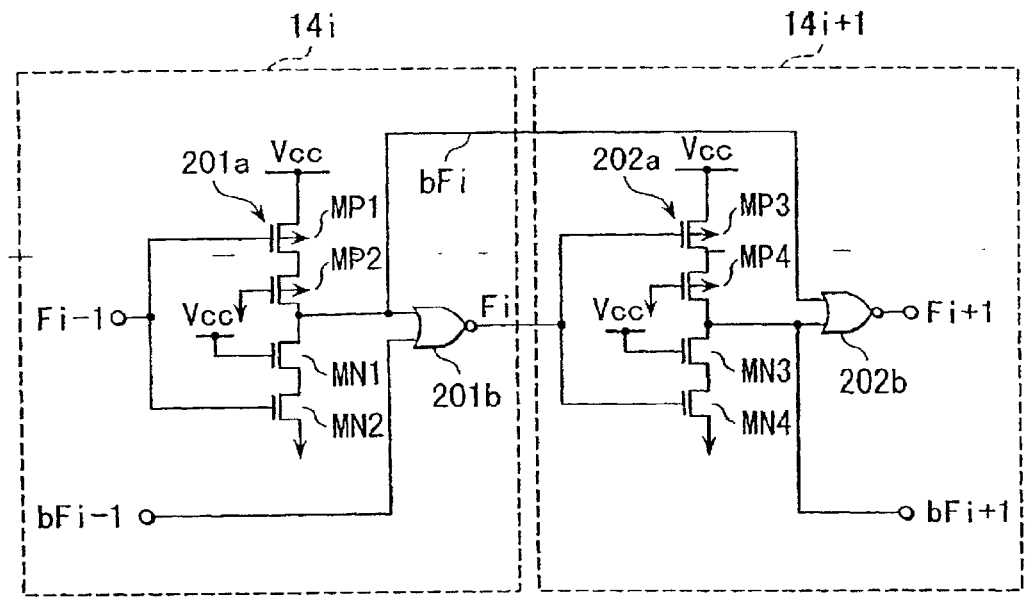
FIG. 28 is a circuit diagram of a unit delay element including a clocked inverter circuit and a logic circuit.

FIG. 28 shows an example of a unit delay element composed of a clocked inverter circuit and a NOR circuit. Unit delay elements 14i and 14i+1 connected in series are composed of clocked inverter circuits 201a and 202a and NOR circuits 201b and 202b. The clocked inverter circuit 201a is composed of PMOS transistors MP1 and MP2 and NMOS transistors MN2 and MN1. The clocked inverter circuit 202a is composed of PMOS transistors MP4 and MP3 and NMOS transistors MN4 and MN3. The output signal from the clocked inverter circuit 201a in the unit delay element 14i and the signal bFi−1 outputted from the clocked inverter circuit in the unit delay element at the preceding stage are supplied to the input terminals of the NOR circuits 201b. Similarly, the output signal from the clocked inverter circuit 202a in the unit delay element 14i+1 and the signal bFi outputted from the clocked inverter circuit 201a in the unit delay element 14i at the preceding stage are supplied to the input terminals of the NOR circuits 202b.

Figure 29:
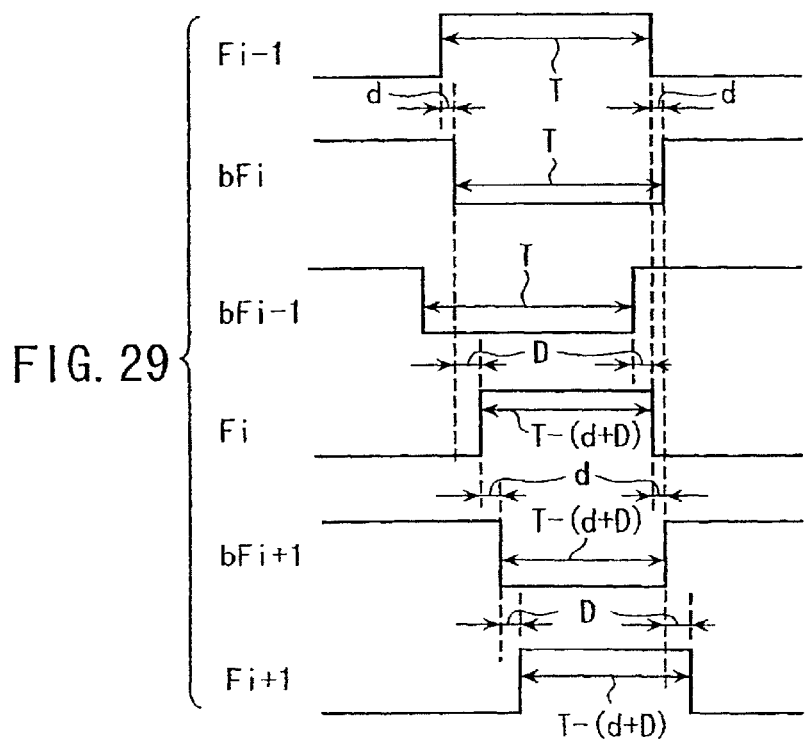
FIG. 29 is a waveform diagram to explain the operation of FIG. 28.

FIG. 29 shows the signals at various sections in FIG. 28. First, a case where a pulse signal Fi−1 with a pulse width of T is supplied to the input terminal of the clocked inverter circuit 201a will be considered. It is assumed that the amount of delay in the falling of the pulse signal Fi at the NMOS transistor and the amount of delay in the rising of the pulse signal at the PMOS transistor in the clocked inverter circuit 201a are both "d". Because the logical threshold values are equalized in the clocked inverter circuit 201a, the amount of delay in the rising and that in the falling are equal. The pulse signal bFi outputted at the output terminal of the clocked inverter circuit 201a is an inverted pulse delayed the amount of delay "d" from the input pulse signal Fi−1. At this time, the pulse width remains unchanged at T.

The signal bFi−1 inputted to the NOR circuit 201b is a signal one stage of unit delay element ahead. Therefore, the signal bFi has the same pulse width T as that of the signal bFi−1 but is delayed for a delay time of d+D from the signal bFi−1. The letter "D" is the amount of delay in both of the rising and falling of the NOR circuit 201b. Because the logical threshold values in the NOR circuit 201b are equalized, the amount of delay in the rising and that in the falling are equal.

The rising of the signal Fi outputted from the NOR circuit 201b is determined by the signal bFi falling later than the signal bFi−1 and lags behind by the amount of delay "D" from the falling of the signal bFi. Similarly, since the falling of the signal Fi is determined by the signal bFi−1 rising earlier and lags behind by the amount of delay "D" from the rising of the signal bFi−1, it is equal to the falling of the rising of the signal Fi−1. The pulse width of the signal Fi is T−(d+D).

The signal Fi is supplied to the clocked inverter circuit 202a in the unit delay element 14i+1. Thus, the rising and falling of the output signal bFi+1 of the clocked inverter circuit 202b both lag behind by the amount of delay "d". The pulse width of the signal bFi+1 is T−(d+D).

The rising of the output signal Fi+1 of the NOR circuit 202b to which the signal bFi+1 and the signal bFi are supplied is determined by the falling of the signal bFi+1 and lags behind by the amount of delay "D" from the signal bFi+1. The falling of the signal Fi+1 lags behind by the amount of delay "D" from the rising of the signal bFi rising with the same timing as that of the signal bFi+1. The pulse width of the signal Fi+1 is T−(d+D).

As described above, after the signal outputted from the NOR circuit 202b has passed through the two unit delay elements, the pulse width of the signal changes from T to T−(d+D). That is, after the signal has passed through the two unit delay elements, the pulse width of the signal becomes shorter by the amount of delay in the unit delay elements. In a delay line composed of unit delay elements, when the pulse width become shorter as described above, the pulse might disappear in the worst state.

Furthermore, when NAND circuits are used in place of the NOR circuits 201b and 202b, the pulse width of the signal passed through the unit delay elements becomes greater because of the logic of the NAND circuit. Thus, in the worst state, adjacent pulse signals might connect with each other.

The SAD synchronizing circuit using the delay line determines the amount of delay in one cycle between a first clock signal and a second clock signal and actually delays the second clock, thereby synchronizing the second clock signal with a third clock signal. That is, the synchronizing circuit is designed to achieve synchronization after two periods. Therefore, the SAD synchronizing circuit has the advantage that the synchronizing speed (Lock-in Time) is fast. If the first clock signal or the second clock signal has jitters (or a phase shift in the clock signal), they have the disadvantage of amplifying the jitters.

To overcome the problems, a method of suppressing the amplification of jitters by calculating the average in two cycles between the first clock signal and the third clock signal has been proposed. Specifically, two signals corresponding to an odd-numbered clock signal and an even-numbered clock signal are used as the control signal for the state holding circuit. NOR circuits are used as the inverter circuits constituting unit delay elements for forward pulse signals and backward pulse signals. In this way, the amplification of jitters is suppressed by averaging the signals in two cycles.

Figure 30A:
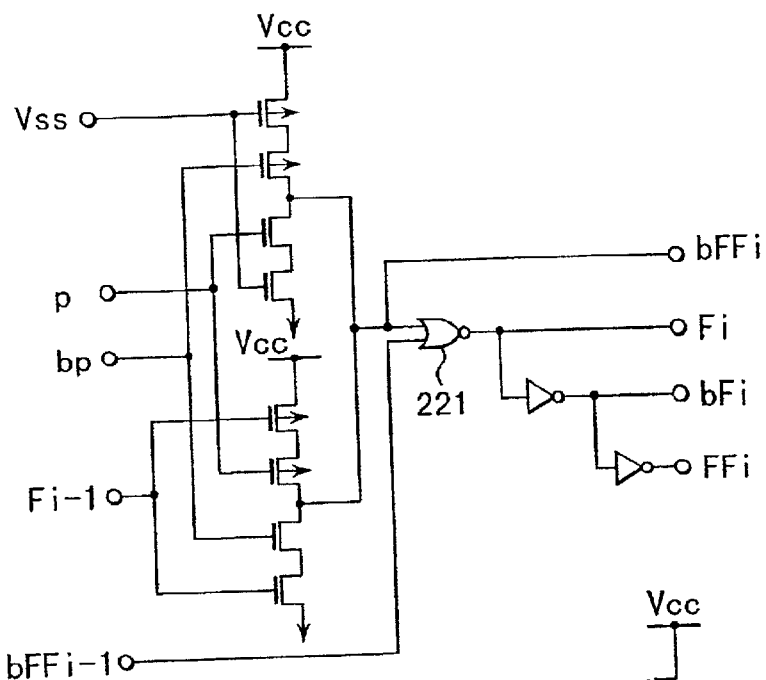
FIG. 30A is a circuit diagram of a unit delay element using a NOR circuit.
Figure 30B:
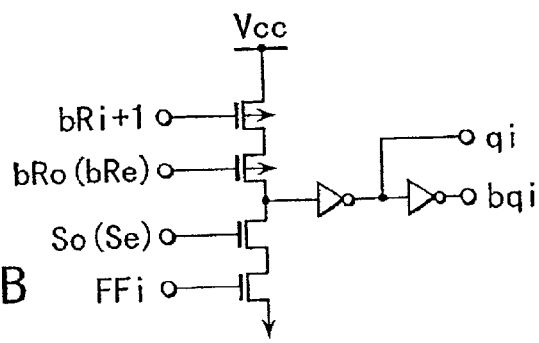
FIG. 30B is a circuit diagram of a state holding circuit.
Figure 31:
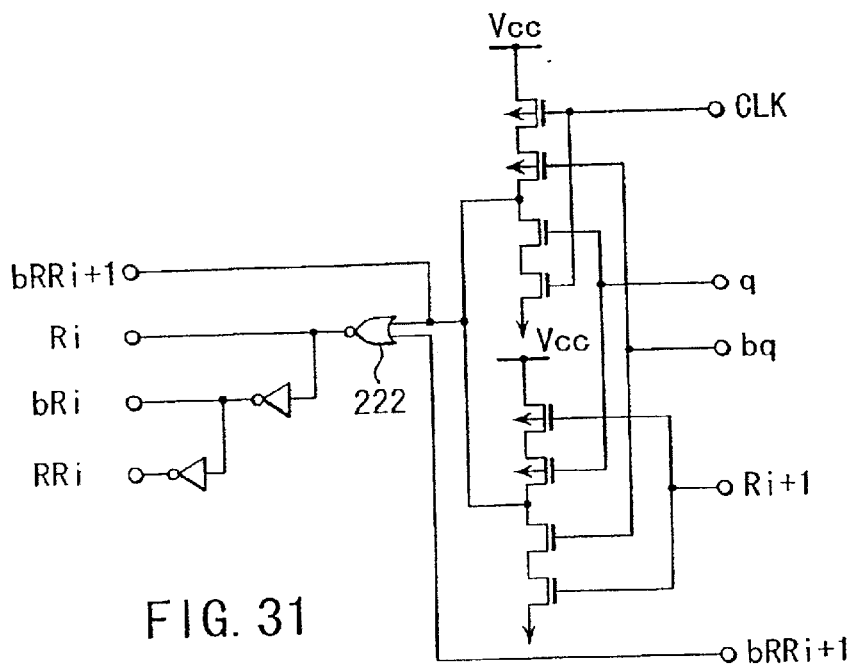
FIG. 31 is a circuit diagram of a unit delay element using a NOR circuit.

FIG. 30A shows a unit delay element which uses a NOR circuit 221 and to which a forward pulse signal is supplied. FIG. 30B shows a state holding circuit controlled by odd-numbered signals bRo and So and even-numbered signals bRe and Se. An odd-numbered state holding circuit is controlled by the signals bRo and So and an even-numbered state holding circuit is controlled by the signals bRe and Se. The signals bRo and So have twice the period of the signal bpm. The signal bRo has almost the same duty ratio as that of the signal bpm, whereas the signal So has almost half the duty ratio of the signal bpm. FIG. 31 shows a unit delay element which uses the NOR circuit 222 and to which a backward signal is supplied. Although a conventional synchronizing circuit permits the amount of jitters δ to be amplified to 3δ, the synchronizing circuit for averaging signals in two cycles suppresses the amplification of jitters to 2δ as shown in FIGS. 30A, 30B, and 31. Since each of the unit delay elements shown in FIGS. 30A, 30B, and 31 is composed of a clocked inverter circuit and a NOR circuit, they have disadvantages in that the pulse width decreases each time the signal passes through the unit delay element as described earlier. Namely, there is a possibility that a clock signal with a long period or with a small duty ratio will disappear in the middle of passing through unit delay elements.

To overcome this problem, a unit delay element in the sixth embodiment is composed of a circuit for widening the pulse width and a circuit for narrowing the pulse width, which makes the pulse width of the input signal of the unit delay element to coincide with that of its output signal.

Figure 32:
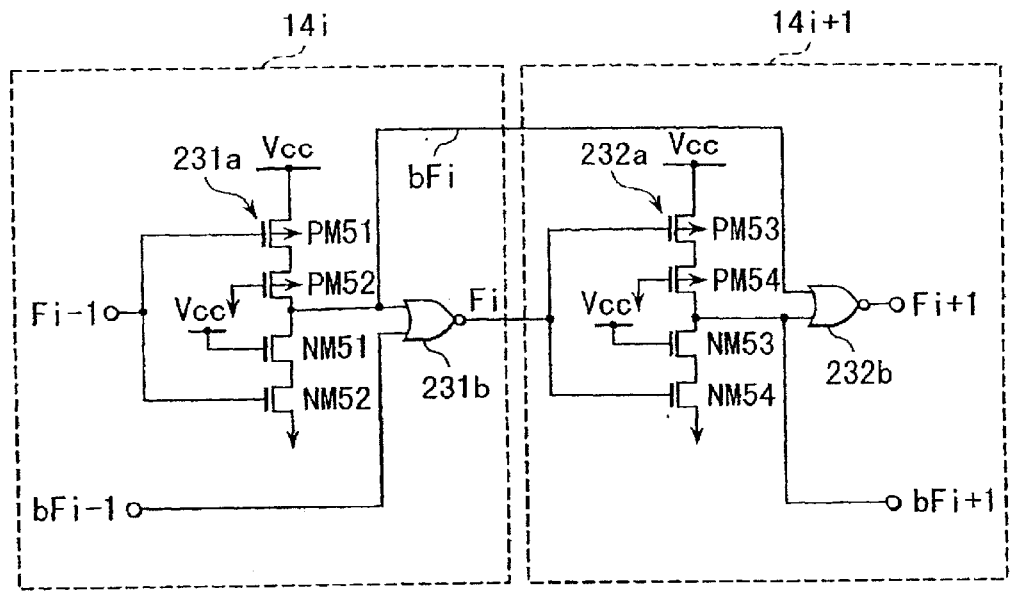
FIG. 32 is a circuit diagram showing a sixth embodiment of the present invention.

Specifically, in the sixth embodiment of FIG. 32, the unit delay elements 14i and 14i+1 are composed of clocked inverter circuits 231a and 232a for widening the pulse width of the input signal and NOR circuits 231b and 232b for narrowing the pulse width.

Figure 33:
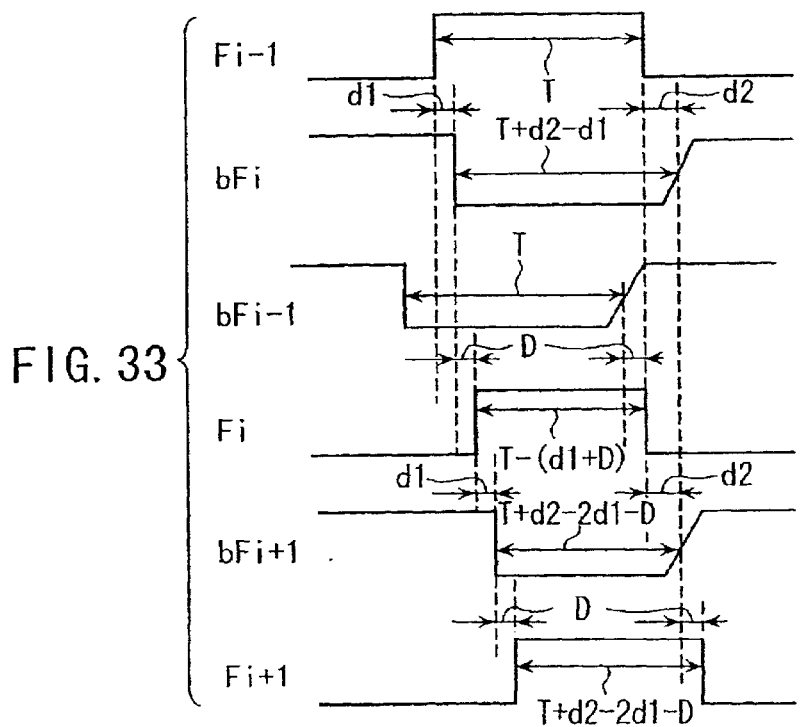
FIG. 33 is a waveform diagram to explain the operation of FIG. 32.

FIG. 33 shows the signals at various sections of the unit delay elements 14i and 14i+1 of FIG. 32. A case where a signal Fi−1 with the pulse width T is supplied to the input terminal of the clocked inverter circuit 231a will be considered.

It is assumed that the amount of delay in the falling of the pulse signal produced by NMOS transistors NM51 and NM52 constituting the clocked inverter circuit 231a is "d1" and the amount of delay in the rising of the pulse signal produced by PMOS transistors PM51 and PM52 constituting the clocked inverter circuit 231a is "d2". In this case, the falling and rising of the output signal bFi of the clocked inverter circuit 231a lag behind by "d1" and "d2" from the signal Fi−1, respectively. The pulse width of the signal bFi is T+d2−d1.

Since the input signal bFi−1 to the NOR circuit 231b is a signal one stage of unit delay element ahead of the signal bFi, it has the pulse width T and the amount of delay "d1+D". The amount of delay D occurs in both the rising and falling of the NOR circuit 231b. Because the logical threshold values are equalized in the NOR circuit 231b, the amount of delay in the rising is equal to that in the falling.

The rising of the output signal Fi of the NOR circuit 231b is determined by the signal bFi rising after the signal bFi−1 and lags behind by the amount of delay "D" from the rising of the signal bFi. The falling of the signal Fi is determined by the signal bFi−1 and lags behind by the amount of delay "D" from the rising of the signal bFi−1. Thus, it is equal to the falling of the signal Fi−1. The pulse width of the signal Fi is T−(d1+D).

In the unit delay element 14i+1, since the signal Fi is supplied to the input terminal of the clocked inverter circuit 232a, the falling of the output signal bFi+1 of the clocked inverter circuit 232a lags behind by the amount of delay "d1" and the rising lags behind by the amount of delay "d2". The pulse width of the signal bFi+1 is T+d2−2d1−D. The signal bFi+1 and the output signal bFi of the clocked inverter circuit 231a are supplied to the NOR circuit 232b. Thus, the rising of the output signal Fi+1 of the NOR circuit 232b is determined by the falling of the signal bFi+1 falling after the signal bFi and lags behind by the amount of delay "D" from the signal bFi+1. In addition, the falling of the signal Fi+1 lags behind by the amount of delay "D" from the rising of the signal bFi+1 and signal bFi. The pulse width of the signal Fi+1 is T+d2−2d1−D.

As described above, after the signal has passed through the two unit delay elements 14i and 14i+1, the pulse width of the signal becomes T+d2−2d1−D. In a case where the amount of delay of each of the clocked inverter circuits 231a and 231b is set so that the equation d2=2d1+D may hold, even when the signal has passed through the two unit delay elements 14i and 14i+1, the signal has the pulse width T and therefore the pulse width remains unchanged. To set the amount of delay to d2=2d1+D, the following method is considered.

The channel width of each of the NMOS transistors NM51, NM52, NM53 and NM54 of the clocked inverter circuits 231a and 231b is made greater and the channel width of each of the PMOS transistors PM51, PM52, PM53 and PM54 is made narrower. By doing this, the pulse width of the signal passed through the clocked inverter circuits 231a and 231b gets wider. That is, making the channel width of the NMOS transistor greater increases the current driving capability of the NMOS transistor, which shortens the rise time of the pulse. In addition, making the channel width of the PMOS transistor narrower decreases the current driving capability of the PMOS transistor, which makes the rise time of the pulse longer. As a result, the pulse width of the signal gets wider.

Now, a method of determining the channel width of the clocked inverter circuits constituting the unit delay element will be explained.

Figure 34A:
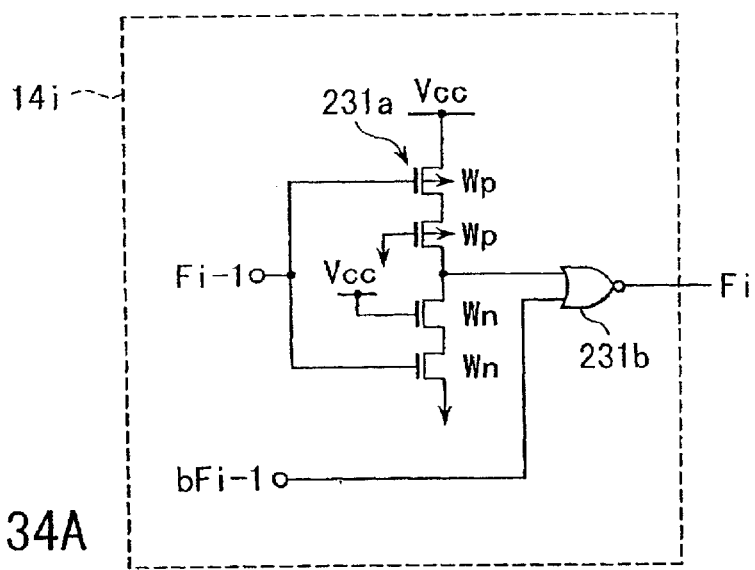
FIG. 34A is a circuit diagram to explain the optimization of a unit delay element and FIG. 34B is a waveform diagram to explain the operation of FIG. 34A.
Figure 34B:
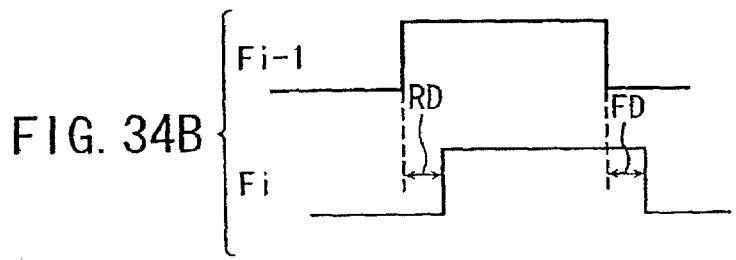

As shown in FIG. 34A, the unit delay element 14i is composed of a clocked inverter circuit 231a and a NOR circuit 231b. It is difficult to achieve optimization by changing the channel width of each of the transistors constituting the clocked inverter circuit 231a and NOR circuit 231b. Therefore, the channel width of each of the transistors constituting the NOR circuit 231b is set so as to equalize the logical threshold values, taking into account the driving capabilities of the NMOS transistors and PMOS transistors. After the channel width of each of the transistors constituting the NOR circuit 231b has been determined, the capacity driven by the NOR circuit 231b is made almost equal to the capacity driven by the clocked inverter circuit 231a, taking into account the gate capacity. By doing this, the sum of the channel width (Wp) of the PMOS transistors constituting the clocked inverter circuit 231a and the channel width (Wn) of the NMOS transistors is determined uniquely. With the sum of the channel widths Wp and Wn fixed (Wp+Wn=constant), the amount of delay "RD" in the rising of the pulse signal and the amount of delay "FD" in the falling of the pulse signal are simulated by changing the channel width Wp or Wn as shown in FIG. 34B. By the simulation, the channel widths Wp and Wn that equalize the amount of delay "RD" in the rising with the amount of delay "FD" in the falling are determined.

Figure 35:
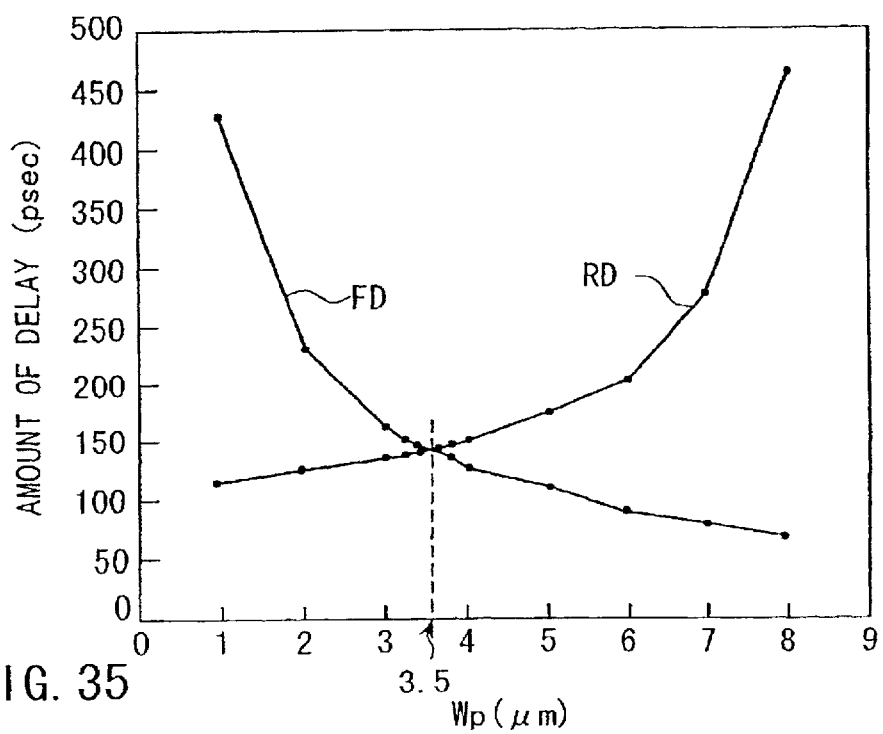
FIG. 35 shows the result of simulation for optimizing the unit delay element shown in FIG. 34A.

FIG. 35 shows the result of the simulation. The ordinate axis represents the amount of delay "RD" in the rising and the amount of delay "FD" in the falling for one stage of unit delay element. The abscissa axis represents the channel width Wp of the PMOS transistors constituting a clocked inverter circuit. With the dimensions that allow the amount of delay in the rising to cross the amount of delay in the falling, the pulse width of the signal passed through the unit delay elements is kept constant. When the amount of delay in the rising is greater than the amount of delay in the falling, the pulse width of the signal passed through the unit delay elements decreases. Conversely, when the amount of delay in the rising is smaller than the amount of delay in the falling, the pulse width of the signal passed through the unit delay elements increases. The present example is based on the assumption that Wp+Wn=9 μm holds, the channel width Wp of a PMOS transistor is 3.5 μm, and the channel width Wn of an NMOS transistor is 5.5 μm.

Conversely, the channel width of the clocked inverter circuit may be determined and thereafter the sum of the channel width of the PMOS transistor and that of the NMOS transistor in the NOR circuit may be made constant, thereby determining the channel width of the NOR circuit at which the amount of delay in the rising becomes equal to the amount of delay in the falling.

Which of the above approaches is better is determined by the absolute value of the amount of delay. Since the accuracy of the synchronizing circuit is determined by the amount of delay in the rising per stage of unit delay element, the one with the smaller absolute value of the amount of delay is better.

The pulse width of the signal can be made greater by changing not only the channel width of the transistors but also the channel length of the transistors, the threshold voltage, or the voltage of the substrate in which the transistors are formed.

When the channel length of the transistors is changed, the channel length of the NMOS transistors constituting the clocked inverter circuit is made shorter and the channel length of the PMOS transistors is made longer.

When the threshold voltage of the transistors is changed, the threshold voltages of the NMOS transistors constituting the clocked inverter circuit are made lower and the threshold voltages of the PMOS transistors are made higher.

When the substrate voltage is changed, the substrate voltage of the NMOS transistors constituting the clocked inverter circuit is made higher and the substrate voltage of the PMOS transistors is made lower.

The method shown in FIG. 35 is not limited to the determination of the channel width and may be applied to the determination of the channel length, threshold voltage, or substrate voltage.

With the sixth embodiment, a unit delay element is composed of a circuit for widening the pulse width and a circuit for narrowing the pulse width. This enables the pulse width of the input signal of a unit delay element to coincide with that of its output signal, which prevents the pulse width of the signal outputted from the unit delay element from getting narrower, even when the unit delay element includes a NOR circuit.

Seventh Embodiment

Figure 36:
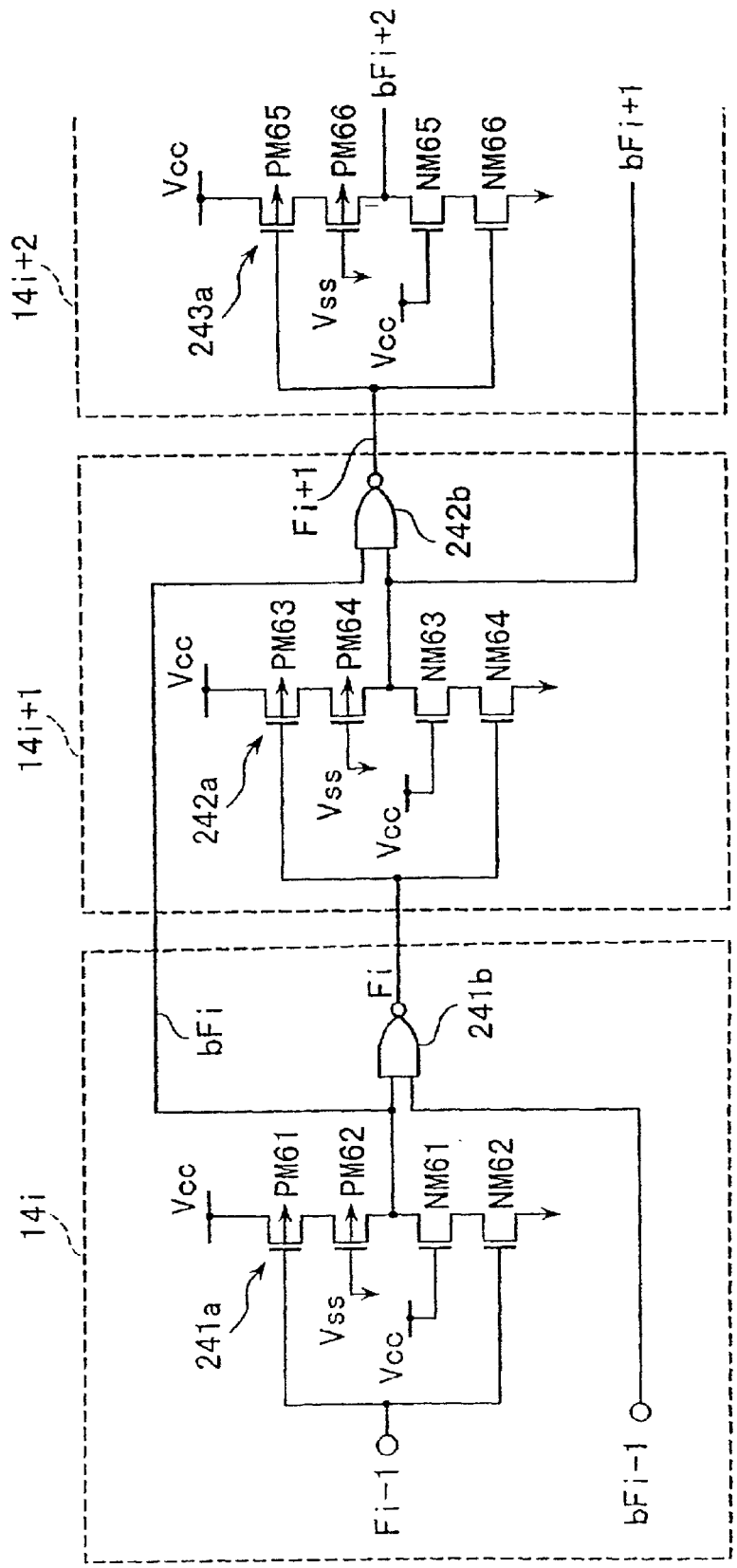
FIG. 36 is a circuit diagram showing a seventh embodiment of the present invention.

FIG. 36 shows a seventh embodiment of the present invention. In the seventh embodiment, a unit delay element is composed of a clocked inverter circuit and a NAND circuit. In unit delay elements 14i, 14i+1 and 14i+2, clocked inverter circuits 241a, 242a and 243a are circuits for narrowing the pulse width of signals passing through the respective unit delay elements. In addition, NAND circuits 241b and 242b are circuits for widening the pulse width of signals passing through the respective unit delay elements.

Figure 37:
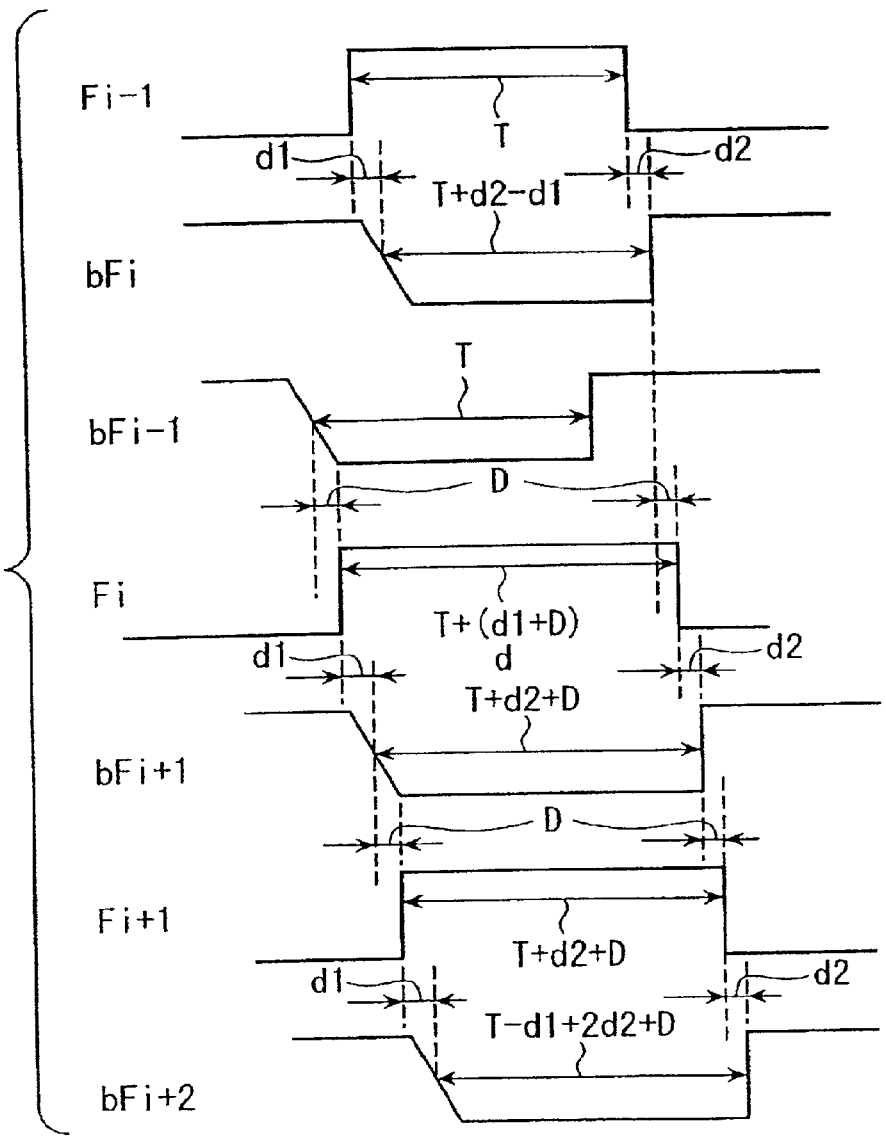
FIG. 37 is a waveform diagram to explain the operation of FIG. 36.

FIG. 37 shows the signals at various sections in FIG. 36. First, consider a case where a signal Fi−1 with the pulse width T is inputted to the input terminal of a clocked inverter circuit 241a. It is assumed that the amount of delay in the falling of the pulse signal produced by the NMOS transistors constituting clocked inverter circuits 241a, 242a and 243a is "d1" and the amount of delay in the rising of the pulse signal produced by the PMOS transistors is "d2". Then, the amount of delay in the falling of and that in the rising of the output signal bFi of the clocked inverter circuit 241a are "d1" and "d2," respectively. Thus, the pulse width of the signal bFi becomes T+d2−d1.

Since the input signal bFi−1 to the NAND circuit 241b is a signal one stage of unit delay element ahead of the signal bFi, it has the pulse width T and the amount of delay "d1+D". The amount of delay D occurs in both the rising and falling of the NAND circuits 241b and 242b. Because the logical threshold values are equalized in the NAND circuits 241b and 242b, the amount of delay in the rising is equal to that in the falling.

The rising of the output signal Fi of the NAND circuit 241b is determined by the signal bFi−1 falling before the signal bFi and lags behind by the amount of delay "D" from the falling of the signal bFi−1. The falling of the signal Fi is determined by the signal bFi falling after the signal bFi−1 and lags behind by the amount of delay "D" from the rising of the signal bFi. The pulse width of the signal Fi is T+(d1+D).

In the next unit delay element 14i+1, the signal Fi is supplied to the input terminal of the clocked inverter circuit 242a. As a result, the falling of the output signal bFi+1 of the clocked inverter circuit 242a lags behind by the amount of delay "d1" from the signal Fi and the rising lags behind by the amount of delay "d2" from the signal Fi. The pulse width of the signal bFi+1 is T+d2+D. The signal bFi+1 and the signal bFi are supplied to the AND circuit 242b. The rising of the output signal Fi+1 of the NAND circuit 242b is determined by the falling of the signal bFi+1 falling before the signal bFi and lags behind by the amount of delay "D" from the signal bFi+1. In addition, the falling of the signal Fi+1 lags behind by the amount of delay "D" from the rising of the signal bFi+1 rising after the signal bFi. The pulse width of the signal Fi+1 is T+d2+D.

In the next unit delay element 14i+2, the signal Fi+1 is supplied to the input terminal of the clocked inverter circuit 243a. As a result, the falling of the output signal bFi+2 of the clocked inverter circuit 243a lags behind by the amount of delay "d1" from the signal Fi+1 and the rising lags behind by the amount of delay "d2" from the signal Fi+1. The pulse width of the signal bFi+1 is T−d1+2d2+D.

As described above, after the signal has passed through the two unit delay elements 14i and 14i+1, and the clocked inverter circuit 243a, the pulse width of the signal becomes T−d1−2d2+D. In a case where the amount of delay is set so that the equation d1=2d2+D may hold, even when the signal has passed through the two unit delay elements 14i and 14i+1 and the inverter circuit 243a, the signal has the pulse width T and therefore the pulse width remains unchanged. To set the amount of delay to d1=2d2+D, the following method is considered.

The channel width of each of the NMOS transistors NM61, NM62, NM63, NM64, NM65 and NM66 of the clocked inverter circuits 241a, 242a and 243a is made narrower and the channel width of each of the PMOS transistors PM61, PM62, PM63, PM64, PM65 and PM66 is made wider. With this setting, the pulse width of the signal passed through the clocked inverter circuits 241a, 242a and 243a gets narrower. That is, making the channel width of the NMOS transistor narrower decreases the current driving capability of the NMOS transistor, which makes the rise time of the pulse longer. In addition, making the channel width of the PMOS transistor wider increases the current driving capability of the PMOS transistor, which makes the rise time of the pulse shorter. As a result, the effective pulse width of the signal gets narrower.

The means for narrowing the pulse width produces the same effects by changing not only the channel width but also at least one of the channel length, the threshold voltage, and the voltage of the substrate.

When the channel length is changed, the channel length of the NMOS transistors constituting the clocked inverter circuits 241a, 242a and 243a is made longer and the channel length of the PMOS transistors is made shorter.

When the threshold voltage of the transistors is changed, the threshold voltages of the NMOS transistors constituting the clocked inverter circuits 241a, 242a and 243a are made higher and the threshold voltages of the PMOS transistors are made lower.

When the substrate voltage is changed, the substrate voltage of the NMOS transistors constituting the clocked inverter circuits 241a, 242a and 243a is made lower and the voltage of the substrate in which the PMOS transistors are formed is made higher.

With the seventh embodiment, a unit delay element is composed of clocked inverter circuits and a NAND circuit. The clocked inverter circuits decrease the pulse width of the signal by the length by which the pulse width of the signal is increased by the NAND circuit. This prevents the pulse width of the signal passed through the unit delay element from getting wider.

The methods in the sixth and seventh embodiments need not incorporate a new circuit into a unit delay element and therefore has the advantage of preventing the area occupied by the circuit from increasing.

In the sixth and seventh embodiments, the first delay line for forward pulse signals that constitutes the synchronizing circuit has been explained. By constructing the second delay line for backward pulse signals similarly, the pulse width of a backward pulse signal can also be kept constant before and after the unit delay element.

Furthermore, a synchronizing circuit may be formed by constructing a first delay line for transferring forward pulse signals and a second delay line for transferring backward pulse signals using the unit delay elements explained in the sixth and seventh embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A delay circuit applied to a synchronizing circuit comprising:

a first delay line which includes unit delay elements and transfers a forward pulse signal;

a second delay line which includes unit delay elements and transfers a backward pulse signal; and a state holding section which is brought into a set state or a reset state according to a transfer position of the forward pulse signal transferred along said first delay line and said backward pulse signal transferred along said second delay line in the set state and a clock signal along said second delay line in the reset state, wherein each of said unit delay elements constituting said first and second delay lines includes:

a clocked inverter circuit to which a first pulse signal corresponding to one of said forward and backward pulse signals output from a preceding delay unit is supplied, said clocked inverter circuit outputting a second pulse signal having one of a first pulse width and a second pulse width, the first pulse width being greater than a pulse width of the first pulse signal and the second pulse width being smaller than the pulse width of the first pulse signal; and a logic circuit to which the second pulse signal output from the clocked inverter circuit and an inverted signal of said first pulse signal are supplied, wherein said logic circuit outputs a third pulse signal, the third pulse signal having the other one of the first pulse width and the second pulse width.

2. The delay circuit according to claim 1, wherein said logic circuit is a NOR circuit and said clocked inverter circuit delays a trailing edge of said first pulse signal.

3. The delay circuit according to claim 1, wherein said logic circuit is a NAND circuit and said clocked inverter circuit delays a leading edge of said first pulse signal.

4. The delay circuit according to claim 1, wherein said clocked inverter circuit is composed of an NMOS transistor and a PMOS transistor, and at least one of a channel width, channel length, threshold voltage and substrate voltage of the NMOS transistor is different from a channel width, channel length, threshold voltage and substrate voltage of the PMOS transistor.

5. The delay circuit according to claim 4, wherein a ratio of a current driving capability of said PMOS transistor to a current driving capability of said NMOS transistor is set at a value other than one and a rise time of said first pulse signal is made different from the decay time of said first pulse signal.

* * * * *